United States Patent
Kono et al.

(10) Patent No.: US 8,335,112 B2
(45) Date of Patent: Dec. 18, 2012

(54) NONVOLATILE SEMICONDUCTOR MEMORY DEVICE

(75) Inventors: Takashi Kono, Tokyo (JP); Ken Matsubara, Tokyo (JP); Takashi Iwase, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 401 days.

(21) Appl. No.: 12/766,603

(22) Filed: Apr. 23, 2010

(65) Prior Publication Data

US 2010/0290290 A1 Nov. 18, 2010

(30) Foreign Application Priority Data

May 14, 2009 (JP) ................................ 2009-117504

(51) Int. Cl.
*G11C 11/34* (2006.01)
(52) U.S. Cl. .......... 365/185.21; 365/185.17; 365/185.18
(58) Field of Classification Search ............. 365/185.03, 365/185.04, 185.22, 185.11, 185.21, 185.17, 365/185.18
See application file for complete search history.

(56) References Cited

U.S. PATENT DOCUMENTS

| 6,778,439 B2 | 8/2004 | Kato |
| 2004/0257874 A1* | 12/2004 | Tanaka et al. ............. 365/185.09 |
| 2008/0019184 A1* | 1/2008 | Mitani et al. ............. 365/185.21 |

FOREIGN PATENT DOCUMENTS

JP 2004-127405 4/2004

* cited by examiner

*Primary Examiner* — Richard Elms
*Assistant Examiner* — Hien Nguyen
(74) *Attorney, Agent, or Firm* — McDermott Will & Emery LLP

(57) ABSTRACT

A nonvolatile semiconductor memory device is provided which can accurately read data with low consumption current. The flash memory selects a memory cell according to an external address signal in response to the leading edge of a clock signal and reads data from the memory cell in response to the leading edge of the clock signal in the normal read mode, whereas, in the low-speed read mode for performing a read operation with lower power consumption than that of the normal read mode, reads data from the memory cell in response to the trailing edge of the clock signal. Therefore, data can be accurately read even if noise is generated in response to the leading edge of the clock signal in the low-speed read mode, because the noise level has dropped at the trailing edge of the clock signal.

11 Claims, 25 Drawing Sheets

NONVOLATILE SEMICONDUCTOR MEMORY DEVICE

CROSS-REFERENCE TO RELATED APPLICATION

The disclosure of Japanese Patent Application No. 2009-117504 filed on May 14, 2009 including the specification, drawings and abstract is incorporated herein by reference in its entirety.

BACKGROUND OF THE INVENTION

This invention relates to a nonvolatile semiconductor memory device, and particularly to a nonvolatile semiconductor memory device comprising a first read mode for performing a normal read operation and a second read mode for performing a read operation with lower power consumption than that of the first read mode.

A flash memory is a nonvolatile semiconductor memory device capable of holding the memorized content even if the power supply voltage is interrupted (see, for example, Japanese Patent Laid-Open No. 2004-127405 (patent document 1)). Flash memories are also being required to reduce power consumption in the wake of recent power saving trend and therefore a low-speed read mode, which is different from the normal read mode, is prepared in particular applications that require significant reduction of power consumption in the read operation, where data is read with a very low clock frequency that is different from the normal mode. In a microcomputer computer, for example, reduction of power consumption is required when the CPU reads program codes from the flash memory.

In such a flash memory, power consumptions by a charge pump circuit that generates an internal voltage higher than the external power supply voltage and by a reference voltage source that generates a reference voltage for reading are large.

With the conventional flash memory, however, there has been a problem that data cannot be read accurately when power consumption of a charge pump circuit or a reference current source is attempted to be reduced.

Therefore, a main object of the present invention is to provide a nonvolatile semiconductor memory device that can accurately read data with low consumption current.

SUMMARY OF THE INVENTION

A nonvolatile semiconductor memory device according to the present invention, which has a first read mode for performing a normal read operation and a second read mode for performing a read operation with lower power consumption than that of the first read mode, comprises a memory block, a selection circuit, and a read circuit. The memory block includes a plurality of memory cells arranged in a plurality of rows and a plurality of columns. The selection circuit selects, in response to the leading edge of a clock signal, any one of the memory cells according to an external address signal. The read circuit reads data from the memory cell selected by the selection circuit in response to the leading edge of the clock signal in the first read mode, whereas, in the second read mode, reads data from the memory cell selected by the selection circuit in response to the trailing edge of the clock signal.

In addition, another nonvolatile semiconductor memory device according to the present invention, which has a first read mode for performing a normal read operation and a second read mode for performing a read operation with lower power consumption than that of the first read mode, comprises a memory block, a selection circuit, and a read circuit. The memory block includes a plurality of memory cells arranged in a plurality of rows and a plurality of columns, where the memory cells are preliminarily divided into a plurality of memory cell groups, each of the memory cell groups is preliminarily divided into N subgroups (N is an integer of two or more), and each of the subgroups includes M memory cells (M is a natural number). The selection circuit selects any one of the memory cell groups according to an external address signal. The read circuit reads data from N×M memory cells belonging to the memory cell group selected by the selection circuit in the first read mode, whereas, in the second read mode, sequentially reads one by one the N subgroups belonging to the memory cell group selected by the selection circuit, and reads data from M memory cells belonging to each selected subgroup.

In addition, yet another nonvolatile semiconductor memory device according to the present invention, which has a first read mode for performing a normal read operation and a second read mode for performing a read operation with lower power consumption than that of the first read mode, comprises a plurality of memory blocks, a selection circuit, a plurality of sense amplifiers, and a reference current supply circuit. Each of the memory blocks includes a plurality of memory cells arranged in a plurality of rows and a plurality of columns. According to an external address signal, the selection circuit selects any one of the memory blocks and any one of the memory cells belonging to the memory block. Each of the sense amplifiers that are respectively provided corresponding to the memory blocks, when a memory cell of a corresponding memory block is selected by the selection circuit, applies a read voltage to the memory cell, compares the current flowing through the memory cell with a reference current, and outputs a data signal having a logic level according to the result of comparison. The reference current supply circuit supplies reference current to each of the sense amplifiers in the first read mode, whereas, in the second read mode, supplies the reference current only to the sense amplifier corresponding to the memory block selected by the selection circuit among the sense amplifiers.

The nonvolatile semiconductor memory device according to the present invention, selects, according to an external address signal, any one of the memory cells in response to the leading edge of the clock signal and reads data from the memory cell selected by the selection circuit in response to the leading edge of the clock signal in the first read mode for performing the normal read operation, whereas, in the second read mode for performing a read operation with lower power consumption than that of the first read mode, reads data from the memory cell selected by the selection circuit in response to the trailing edge of the clock signal. Therefore, data can be accurately read even if noise is generated in response to the leading edge of the clock signal in the second read mode with low power consumption, because the noise level has dropped at the trailing edge of the clock signal.

Additionally, another nonvolatile semiconductor memory device according to the present invention divides the memory cells of a memory block into a plurality of memory cell groups, divides each of the memory cell groups into N subgroups, each of which includes M memory cells, and reads data from N×M memory cells belonging to the memory cell group selected by the selection circuit in the first read mode for performing the normal read operation, whereas, in the second read mode for performing a read operation with lower power consumption than that of the first read mode, sequentially selects one by one N subgroups belonging to the selected memory cell group, and reads data from M memory cells belonging to each selected subgroup. Because data read operation is divided into N stages, the level of noise generated in the source line can be reduced, and data can be accurately read.

In addition, a yet another nonvolatile semiconductor memory device according to the present invention supplies the reference current to each of the sense amplifiers in the first read mode for performing the normal read operation, whereas, in the second read mode, supplies the reference current only to the sense amplifier corresponding to the memory block selected by the selection circuit among the sense amplifiers. Therefore, data can be accurately read with low power consumption.

DETAILED DESCRIPTION OF PREFERRED EMBODIMENTS

Figure 1:
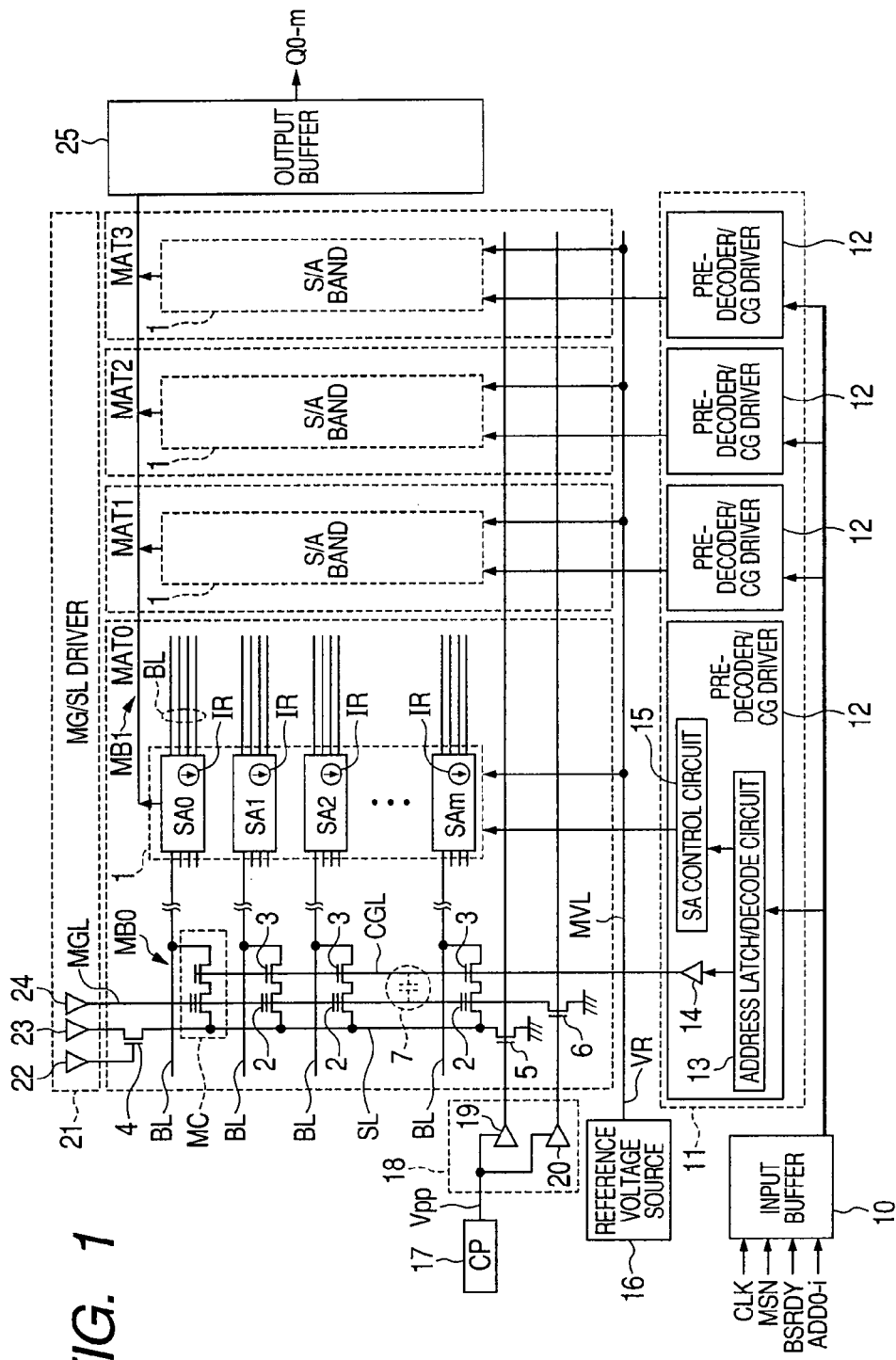
FIG. 1 is a circuit block diagram illustrating a configuration of a flash memory that is the basis of the present invention.

Before describing the embodiments, a flash memory that is the basis of the present invention will be described first. As shown in FIG. 1, the flash memory has a plurality (four in the drawing) of memory mats MAT0 to MAT3, an input buffer 10, a control circuit 11, a reference voltage source 16, a charge pump circuit (CP) 17, an MG/SL control circuit 18, an MG/SL driver 21, and an output buffer 25.

Each memory mat MAT includes two memory blocks MB0 and MB1 and a sense amplifier band 1 (S/A band) provided therebetween. Each memory block MB includes a plurality of memory cells MC arranged in a plurality of rows and a plurality of columns, a plurality of memory gate lines MGL respectively provided corresponding to a plurality of rows, a plurality of control gate lines (read control lines) CGL respectively provided corresponding to a plurality of rows, a plurality of bit lines BL respectively provided corresponding to a plurality of rows, and a source line SL.

Each memory cell MC, which is a split gate memory cell, includes a memory transistor 2 and an access transistor 3 (N-channel MOS transistor) serially coupled between the source line SL and a corresponding bit line BL. The gate of the memory transistor 2 is coupled to a corresponding memory gate line MGL and the gate of the access transistor 3 is coupled to a corresponding control gate line CGL.

The memory transistor 2 has a floating gate. By controlling the amount of charge accumulated in the floating gate, threshold voltage of the memory transistor 2 can be controlled. For example, data "0" ("H" level) can be stored in the memory cell MC by setting the threshold voltage of the memory transistor 2 to a first voltage and data "1" ("L" level) can be stored in the memory cell MC by setting the threshold voltage of the memory transistor 2 to a second voltage which is different from the first voltage.

Here, it is assumed that the first voltage is a positive voltage and the second voltage is a negative voltage. In a read operation, a ground voltage GND (0V) is applied to the gate of the memory transistor 2 to compare the current flowing through the memory transistor 2 with the reference current. If the current flowing through the memory transistor 2 is smaller than the reference current, the memory transistor 2 has data "0" stored therein because the threshold voltage of the memory transistor 2 is a positive voltage. If, on the other hand, the current flowing through the memory transistor 2 is larger than the reference current, the memory transistor 2 has data "1" stored therein because the threshold voltage of the memory transistor 2 is a negative voltage.

In addition, each memory block MB includes N-channel MOS transistors 4 and 5, and an N-channel MOS transistor 6 provided corresponding to each memory gate line MGL. The N-channel MOS transistor 4 is coupled between an MG/SL driver 10 and one end of the source line SL. The N-channel MOS transistor 5 is coupled between the other end of the source line SL and a line of the ground voltage GND. The N-channel MOS transistor 6 is coupled between one end of a corresponding memory gate line MGL and a line of the ground voltage GND.

In a read operation, the N-channel MOS transistor 4 corresponding to the selected memory cell MC is turned off whereas the N-channel MOS transistors 5 and 6 corresponding to the memory cell MC are turned on. The ground voltage GND is thereby applied to the gate and source of the memory transistor 2 of the memory cell MC, allowing data to be read from the memory cell MC.

In a write operation or an erase operation, the N-channel MOS transistor 4 corresponding to the selected memory cell MC is turned on, whereas the N-channel MOS transistors 5 and 6 corresponding to the memory cell MC are turned off. A predefined voltage can thereby be applied to each of the gate and source of the memory transistor 2 of the memory cell MC, allowing the data to be written or erased.

In addition, each sense amplifier band 1 includes a plurality of sense amplifiers SA0 to SAm (here m is a natural number). A plurality of bit lines BL of respective memory blocks MB is preliminarily grouped into groups of n lines (here n is an integer of two or more), each memory block MB having m+1 bit line groups (here m is a natural number). The sense amplifiers SA0 to SAm are provided in common to two memory blocks MB0 and MB1, respectively corresponding to m+1 bit line groups.

Each sense amplifier SA, which is activated in the read operation, applies a read voltage to a bit line BL selected among n bit lines BL corresponding to the memory block MB selected from the two memory blocks MB0 and MB1, compares the current flowing through the bit line BL with the reference current IR, and outputs a data signal Q with a level according to the result of comparison.

The input buffer 10 transmits a clock signal CLK, control signals MSN and BSRDY, and address signals ADD0 to ADDi to the control circuit 11. The control circuit 11 includes a pre-decoder/CG driver 12 provided corresponding to each memory mat MAT. Each pre-decoder/CG driver 12 includes an address latch/decode circuit 13, a buffer 14 provided corresponding to each control gate line CGL, and a sense amplifier control circuit 15.

The address latch/decode circuit 13 selects any one of the control gate lines CGL in response to an external signal provided via the input buffer 10 and sets the control gate line CGL to a selection level "H" via the buffer 14. Each access transistor 3 corresponding to the control gate line CGL is thereby turned on, allowing data to be read from each memory cell MC corresponding to the control gate line CGL. In addition, the sense amplifier control circuit 15 controls corresponding sense amplifiers SA0 to SAm in response to an internal control signal from the address latch/decode circuit 13.

The reference voltage source 16 generates a reference voltage VR for flowing the reference current IR in each sense amplifier SA. The reference voltage VR is provided to each sense amplifier SA of each memory mat MAT. The charge pump circuit 17 generates a high voltage Vpp which is higher than the power supply voltage Vdd. The MG/SL control circuit 18 includes buffers 19 and 20 driven by the high voltage Vpp and the ground voltage GND. In a read operation, the buffers 19 and 20 respectively supply the high voltage Vpp to the gates of the N-channel MOS transistors 5 and 6 to turn on the transistors 5 and 6, whereas, in a write operation or an erase operation, supply the ground voltage GND to the gates of the transistors 5 and 6 to turn off the transistors 5 and 6.

The MG/SL driver 21 includes buffers 22 and 23 provided corresponding to each N-channel MOS transistor 4, and a buffer 24 provided corresponding to each memory gate line MGL. In a read operation, the MG/SL driver 21 turns off the transistor 4 so that the memory gate line MGL is not driven. In a write operation or an erase operation, on the other hand, the MG/SL driver 21 turns on the transistor 4 and applies a predefined voltage to each of the source line SL and the memory gate line MGL. The output buffer 25 outputs (m+1)-bit data signals Q0 to Qm, which have been read from the selected memory mat MAT, to the outside.

Figure 2:
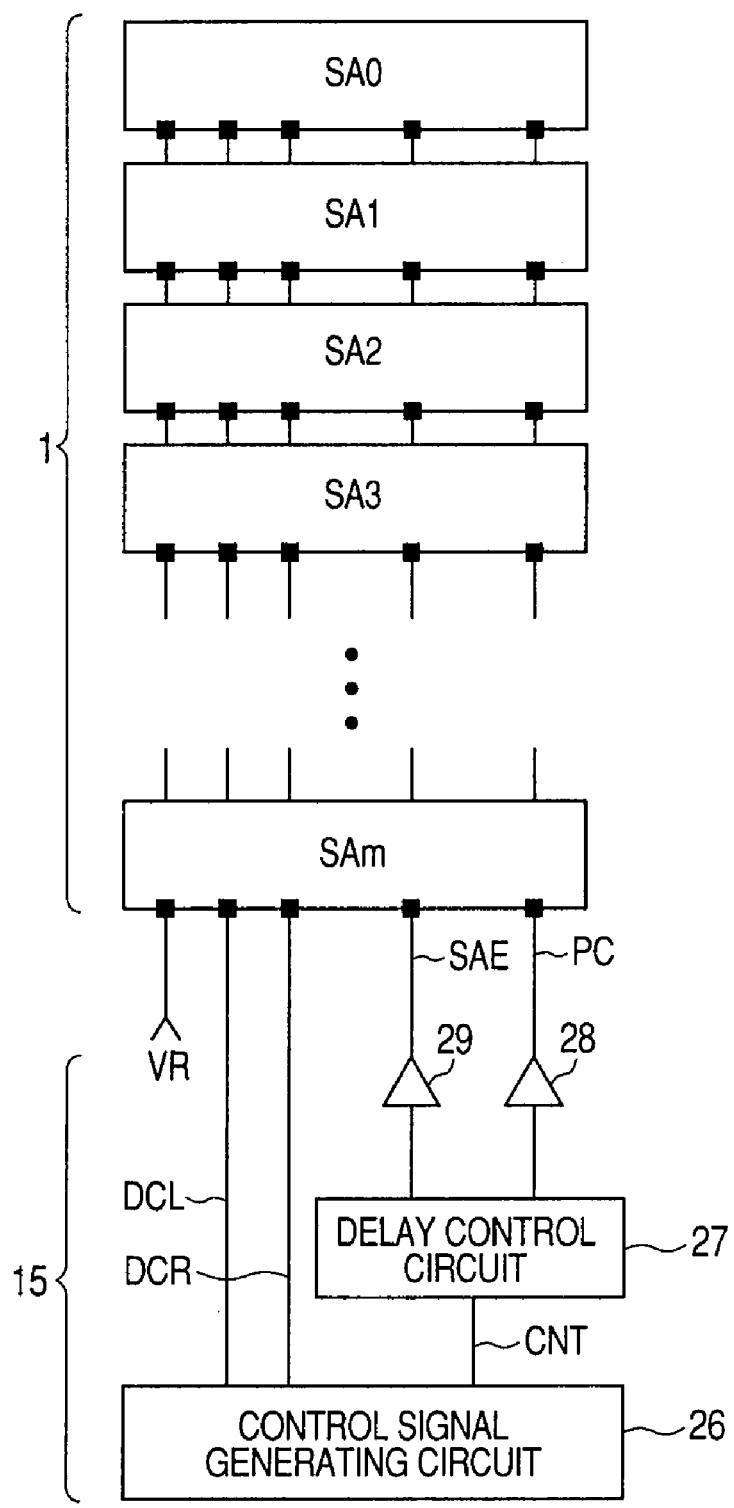
FIG. 2 is a circuit block diagram illustrating a configuration of a sense amplifier control circuit shown in FIG. 1.

FIG. 2 is a circuit block diagram illustrating a configuration of the sense amplifier control circuit 15. In FIG. 2, the sense amplifier control circuit 15 includes a control signal generating circuit 26, a delay control circuit 27, and buffers 28 and 29. The control signal generating circuit 26 generates internal control signals DCL, DCR, and CNT in response to an internal control signal from the address latch/decode circuit 13. The signals DCL and DCR are supplied to each of the corresponding sense amplifiers SA0 to SAm. The delay control circuit 27 delays the signal CNT to generate a precharge signal PC and a sense amplifier activation signal SAE. The signals PC and SAE are provided to each of the corresponding sense amplifiers SA0 to SAm.

Figure 3:
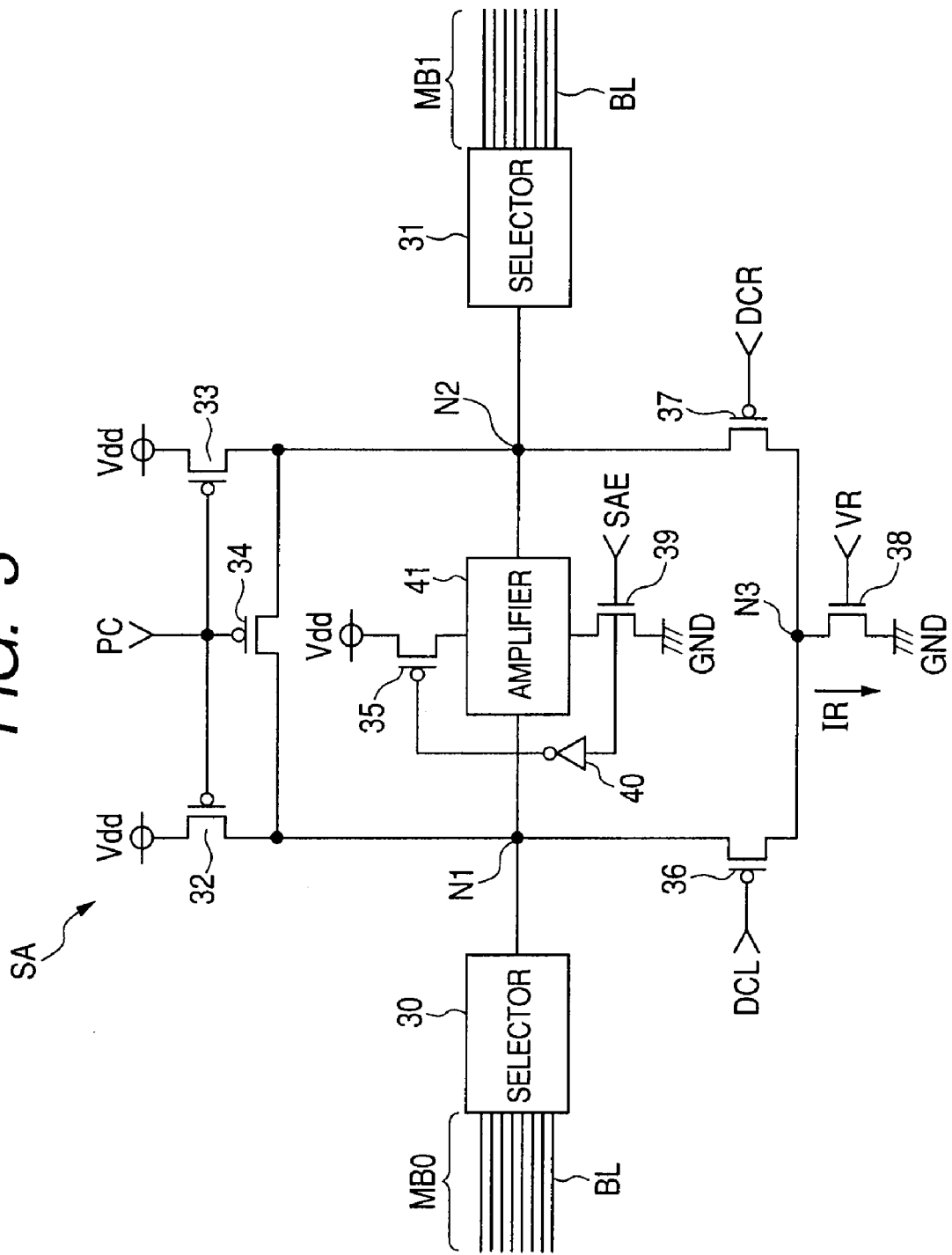
FIG. 3 is a circuit block diagram illustrating a configuration of a sense amplifier shown in FIG. 2.

FIG. 3 is a circuit block diagram illustrating a configuration of the sense amplifier SA. In FIG. 3, the sense amplifier SA includes selectors 30 and 31, P-channel MOS transistors 32 to 37, N-channel MOS transistors 38 and 39, an inverter 40, and an amplifier 41. The sources of the P-channel MOS transistors 32 and 33 both receive the power supply voltage Vdd, the drains thereof are respectively coupled to output nodes N1 and N2. The P-channel MOS transistor 34 is coupled between the output nodes N1 and N2. Respective gates of the transistors 32 to 34 receive the precharge signal PC.

The selector 30 couples the bit line BL specified by the address signals ADD0 to ADDi, among the n bit lines BL of the memory block MB0, to the output node N1. The selector 31 couples the bit line BL specified by the address signals ADD0 to ADDi, among the n bit lines BL of the memory block MB1, to the output node N2. When the precharge signal PC is set to "L", the transistors 32 and 33 are turned on, and the two bit lines BL selected by the output nodes N1 and N2 and the selectors 30 and 31 are charged up to the power supply voltage Vdd.

The sources of P-channel MOS transistors 36 and 37 are respectively coupled to the output nodes N1 and N2, the gates thereof receive internal control signals DCL and DCR from the control signal generating circuit 26, and the drains thereof are coupled in common to the node N3. An N-channel MOS transistor 38 is coupled between the node N3 and the line of the ground voltage GND, and the gate thereof receives the reference voltage VR.

When the memory block MB0 is selected, the signal DCL is maintained at "H" level, whereas the signal DCR falls to "L" level, and the transistor 37 is turned on. Electric current with a level according to the data stored in the selected memory cell MC thereby flows out from the node N1 via the selector 30, and the reference current IR flows out from the node N2 via the transistors 37 and 38. If the current flowing out from the node N1 is larger than the reference current IR, the voltage of the node N1 becomes lower than that of the node N2. If, on the contrary, the current flowing out from the node N1 is smaller than the reference current IR, the voltage of the node N1 becomes higher than that of the node N2.

When the memory block MB1 is selected, the signal DCL falls to "L" level while the signal DCR is maintained at "H" level and the transistor 36 is turned on. Electric current with a level according to the data stored in the selected memory cell MC thereby flows out from the node N2 via the selector 31, and the reference current IR flows out from the node N1 via the transistors 36 and 38. If the current flowing out from the node N2 is larger than the reference current, the voltage of the node N2 becomes lower than that of the node N1. If, on the contrary, the current flowing out from the node N2 is smaller than reference current IR, the voltage of the node N2 becomes higher than that of the node N1.

A P-channel MOS transistor 35 is coupled between a line of the power supply voltage Vdd and the positive side power supply node of the amplifier 41, whereas an N-channel MOS transistor 39 is coupled between the negative side power supply node of the amplifier 41 and a line of the ground voltage GND. The sense amplifier activation signal SAE is directly input to the gate of the transistor 39 and is also input to the gate of the transistor 35 via the inverter 40.

When the signal SAE is set to the activation level "H", the transistors 35 and 39 are turned on to activate the amplifier 41. The amplifier 41 amplifies the difference of voltage between the output nodes N1 and N2 up to the power supply voltage Vdd.

Figure 4:
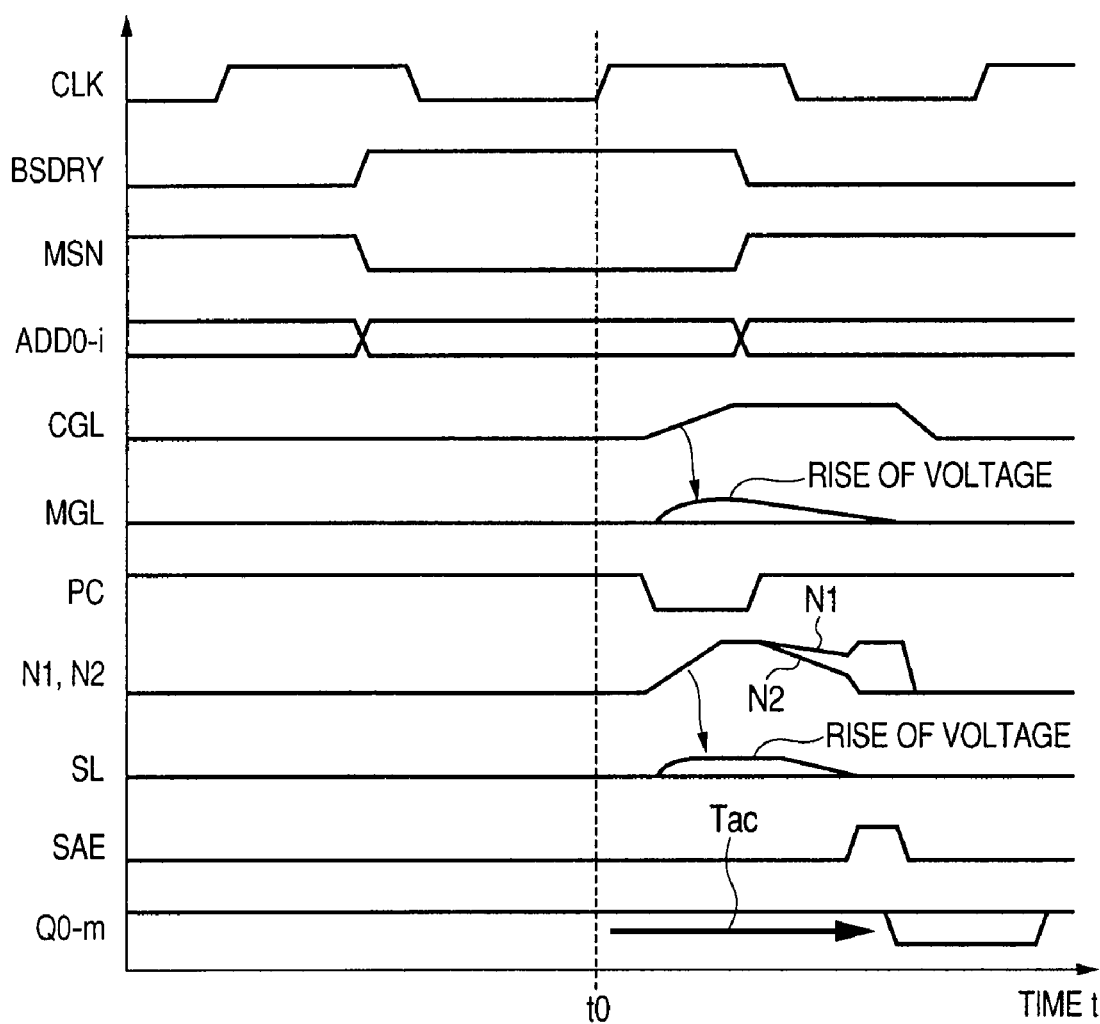
FIG. 4 is a time chart illustrating a read operation of the flash memory shown in FIGS. 1 to 3.

FIG. 4 is a time chart illustrating a read operation of the flash memory. In FIG. 4, it is determined that a read operation is requested when the external control signal BSDRY is set to "H" level and the external control signal MSN is set to "L" level at the leading edge of the clock signal CLK, whereby external address signals ADD0 to ADDi are taken in and the read operation is started (time t0).

The control gate line CGL specified by the external address signals ADD0 to ADDi rises to "H" level, and control of each sense amplifier SA corresponding to the control gate line CGL is started. First, the precharge signal PC is set to "L" level for a predefined time period, and the nodes N1 and N2 as well as the selected two bit lines BL are charged up to the power supply voltage Vdd.

Next, the transistor 37, of the transistors 36 and 37, which corresponds to a memory block (MB1, in this case) different from the selected memory block (MB0, for example) is turned on, and whereby difference of voltage occurs between the nodes N1 and N2 with a polarity according to the logic of the data stored in the selected memory cell MC. Subsequently, the sense amplifier activation signal SAE is set to "H" level for a predefined time period, and the difference of voltage between the output nodes N1 and N2 is amplified by the amplifier 41 up to the power supply voltage Vdd. For example, the voltage of the output node N1 is provided to the output buffer 25 as a read data signal Q. The output buffer 25 outputs the (m+1)-bit data signals Q0 to Qm from the selected memory mat MAT to the outside.

The access time Tac from the start of data read operation to the start of data output operation must be equal to or shorter than one cycle of the clock signal CLK, because it is necessary to determine the data signals Q0 to Qm at the leading edge subsequent to the leading edge of the clock signal CLK that started the data read operation.

In such a flash memory, additionally, there is a coupling capacitance 7 between the adjacent control gate line and memory gate line MGL, as shown in FIG. 1. Therefore, as shown in FIG. 4, raising the control gate line CGL to "H" level may result in occurrence of noise (rise of voltage) in the memory gate line MGL via the coupling capacitance 7. If noise is generated in the memory gate line MGL, the threshold voltage of the memory transistor 2 varies equivalently, which may result in variation of the current flowing through the memory transistor 2 and cause an error in the data read operation. In order to avoid such a situation, a high voltage Vpp (5V, for example) is applied to the gate of the transistor 6 in the read operation, and the memory gate line MGL is coupled to a line of the ground voltage GND with the transistor 6 set to a low resistance value.

In addition, if the charge that has been precharged to the bit line BL is discharged to the source line SL via the memory cell MC, noise (rise of voltage) is generated in the source line SL, as shown in FIG. 1. Margin of the sense operation may degrade if the noise in the source line SL is large. In order to avoid such a situation, a high voltage Vpp is applied to the gate of the transistor 5 in the read operation, and the source line SL is coupled to a line of the ground voltage GND with the transistor 5 set to a low resistance value.

In a microcomputer including such a flash memory, reduction of power consumption has been required when the CPU reads program codes stored in the flash memory. Therefore a low-speed read mode which is different from the normal read mode is provided for particular applications in which significant reduction of power consumption is desired. In the low-speed read mode, read operation is performed with a very low clock frequency which is different from the normal read mode.

However, direct current is constantly flowing in the charge pump circuit 17 and the reference voltage source 16. In the low-speed read mode, particularly, ratio of direct current in the entire electric current relatively increases because alternating current component decreases. Therefore, it is necessary in such a flash memory to reduce consumption current of the charge pump circuit 17 and the reference voltage source 16 without degrading the read margin.

[Embodiment 1]

Figure 5:
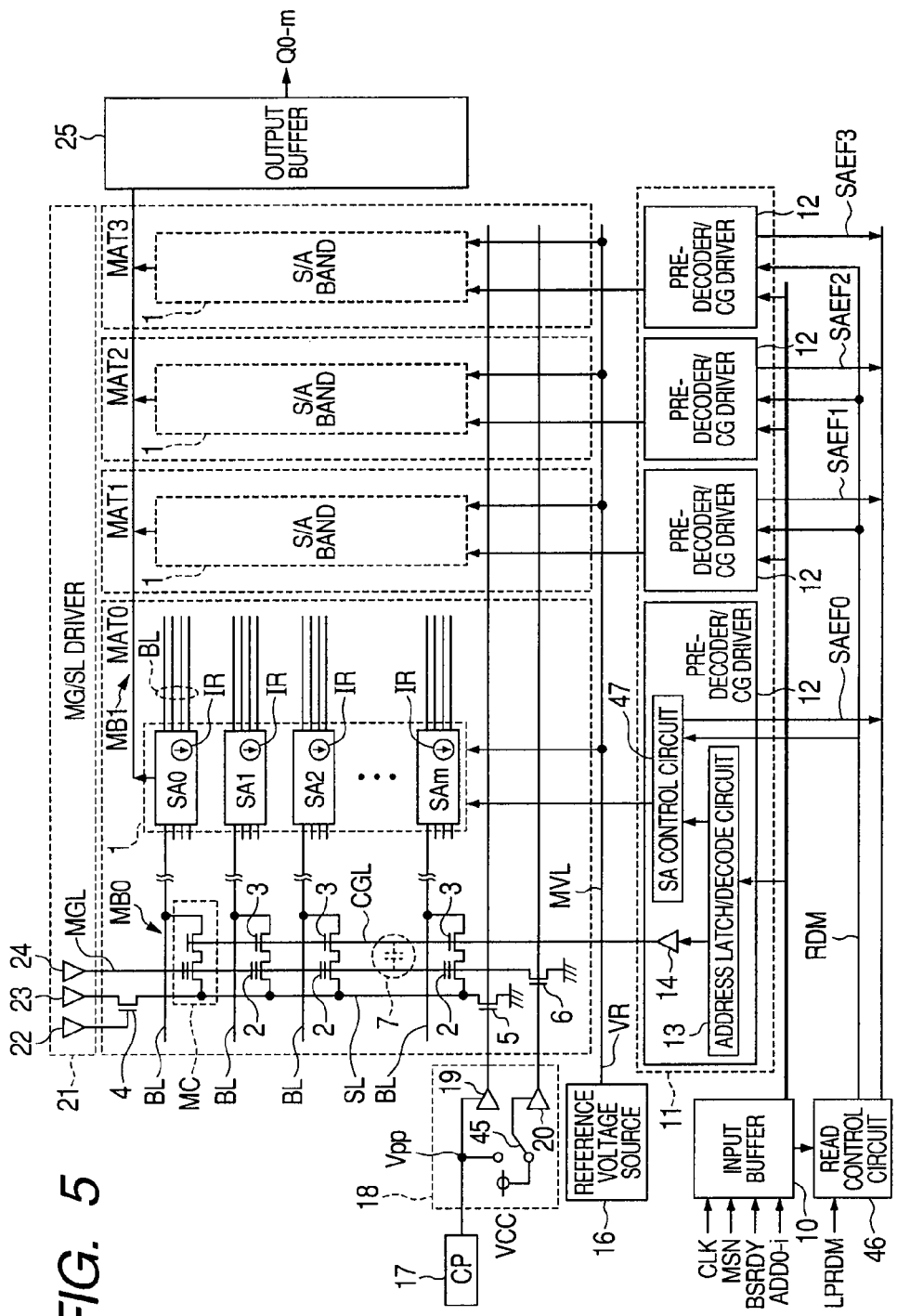
FIG. 5 is a circuit block diagram illustrating a configuration of a flash memory according to an embodiment 1 of the present invention.

FIG. 5 is a circuit block diagram illustrating a configuration of the flash memory according to the embodiment 1 of the present invention, for comparison with FIG. 1. The flash memory of FIG. 5 differs from the flash memory of FIG. 1 in that a switch 45 is added to the MG/SL control circuit 18, a read control circuit 46 is added, and the sense amplifier control circuit 15 is replaced by a sense amplifier control circuit 47.

The switch 45 provides a high voltage Vpp to the buffer 20 in the normal read mode and provides an external power supply voltage VCC to the buffer 20 in the low-speed read mode. Here, the power supply voltage Vdd may be a voltage to which the external power supply voltage VCC is lowered, or a voltage supplied from the outside and is lower than the external power supply voltage VCC.

An external control signal LPRDM is input to the read control circuit 46. The external control signal LPRDM is set to "L" in the normal read mode, whereas the external control signal LPRDM is set to "H" in the low-speed read mode. The read control circuit 46 sequentially sets the precharge signal PC and the sense amplifier activation signal SAE to activation level in response to the leading edge of the clock signal CLK, as shown in FIG. 4, when the external control signal LPRDM is at the "L" level. In addition, the read control circuit 46 sequentially sets the precharge signal PC and the sense amplifier activation signal SAE to activation level in response to the trailing edge subsequent to the leading edge of the clock signal CLK when the external control signal LPRDM is at the "H".

Figure 6:
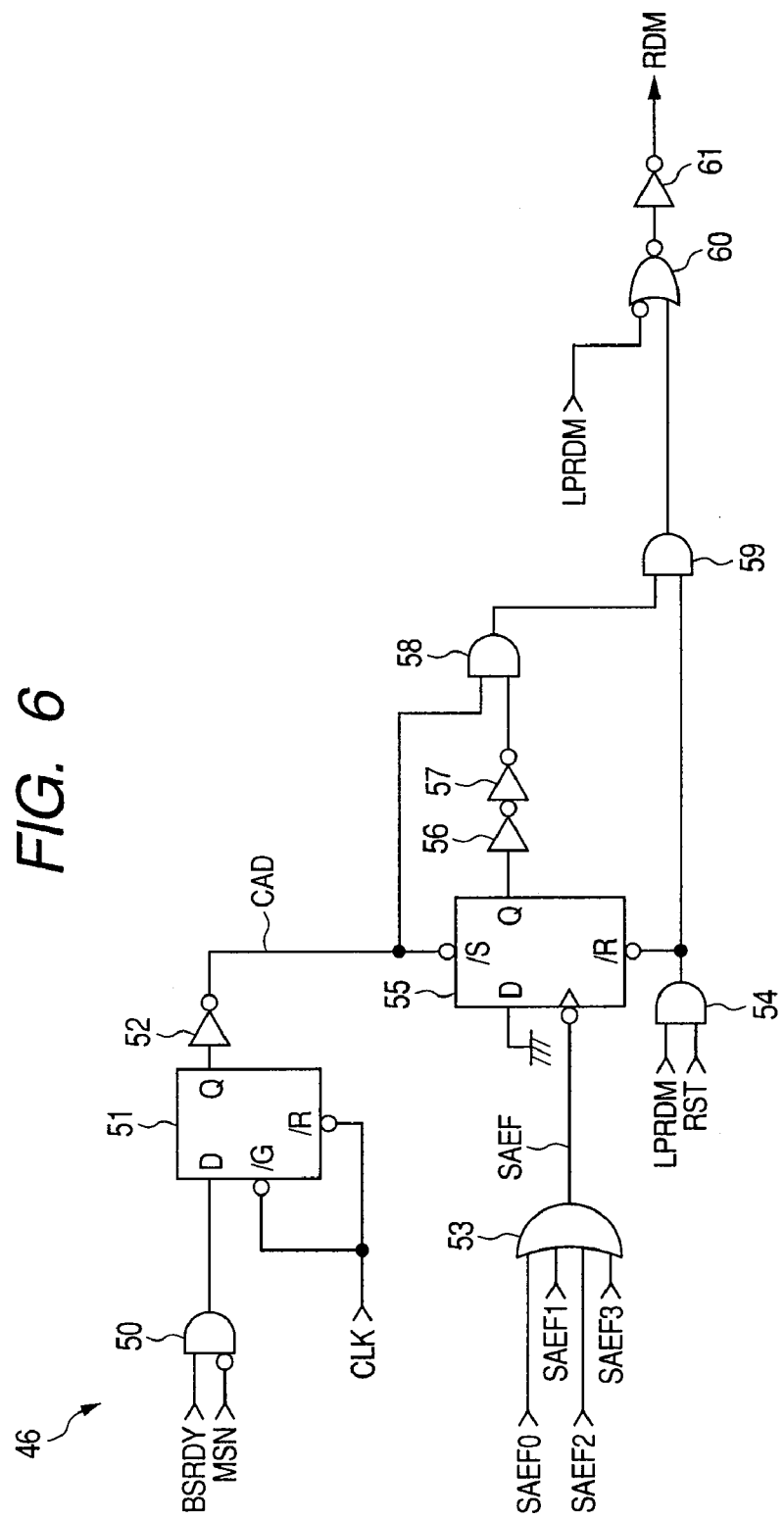
FIG. 6 is a circuit block diagram illustrating a configuration of a read control circuit shown in FIG. 5.

FIG. 6 is a circuit block diagram illustrating a configuration of the read control circuit 46. In FIG. 6, the read control circuit 46 includes gate circuits 50 and 60, a latch circuit 51, inverters 52, 56, 57 and 61, an OR gate 53, AND gates 54, 58 and 59, and a flip-flop 55.

The gate circuit 50 outputs an "H" signal when the external control signal BSRDY is set to "H" and the external control signal MSN is set to "L". The output signal of the gate circuit 50 is input to a data input terminal (D) of the latch circuit 51. The clock signal CLK is input to the gate terminal (/G) and the reset terminal (/R) of the latch circuit 51. If the clock signal CLK is at "L", the latch circuit 51 is reset and its output signal turns to "L". If, on the other hand, the clock signal CLK is at "H", the latch circuit 51 holds and outputs the input signal at the time point when the clock signal CLK rises from "L" to "H". The output signal of the latch circuit 51 is inverted by the inverter 52 to be a signal CAD.

Therefore, the signal CAD falls from "H" to "L" if the external control signal BSRDY is at "H" and the external control signal MSN is at "L" at the leading edge of the clock signal CLK. In addition, the signal CAD rises to "H" in response to the trailing edge of the clock signal CLK. The signal CAD is input to the set terminal (/S) of the flip-flop 55 and is also input to one of the input terminals of the AND gate 58.

The OR gate 53 provides the logical sum signal SAEF of the signals SAEF0 to SAEF3 from the four sense amplifier control circuits 47 to the clock terminal of the flip-flop 55. The AND gate 54 provides the logical product signal of the external control signal LPRDM and the reset signal RST to the reset terminal (/R) of the flip-flop 55, as well as one of the input terminals of the AND gate 59. The reset signal RST turns to "L" when reset from the outside, or during write or erase operation. The ground voltage GND ("L") is applied to the input terminal (D) of the flip-flop 55.

When the signal CAD falls to "L", the flip-flop 55 is set and its output signal turns to "H". In addition, when the signal SAEF falls to "L", the flip-flop 55 outputs an input signal and its output signal turns to "L". In addition, when at least one of the signals LPRDM and RS turns to "L", the flip-flop 55 is reset and its output signal turns to "L".

The output signal of the flip-flop 55 is input to the other input terminal of the AND gate 58 via the inverters 56 and 57. The output signal of the AND gate 58 is input to the other input terminal of the AND gate 59. A gate circuit 60 and an inverter 61 output, as a signal RDM, the logical sum signal of the inverted signal of the signal LPRDM and the output signal of the AND gate 59.

Therefore, the signal RDM rises to "H" in response to the leading edge of the signal CAD, and falls to "L" in response to the trailing edge of the signal SAEF. Read operation is prohibited if the signal RDM is at "L", whereas read operation is permitted if the signal RDM is at "H". The signal RDM is input to each sense amplifier control circuit 47.

Figure 7:
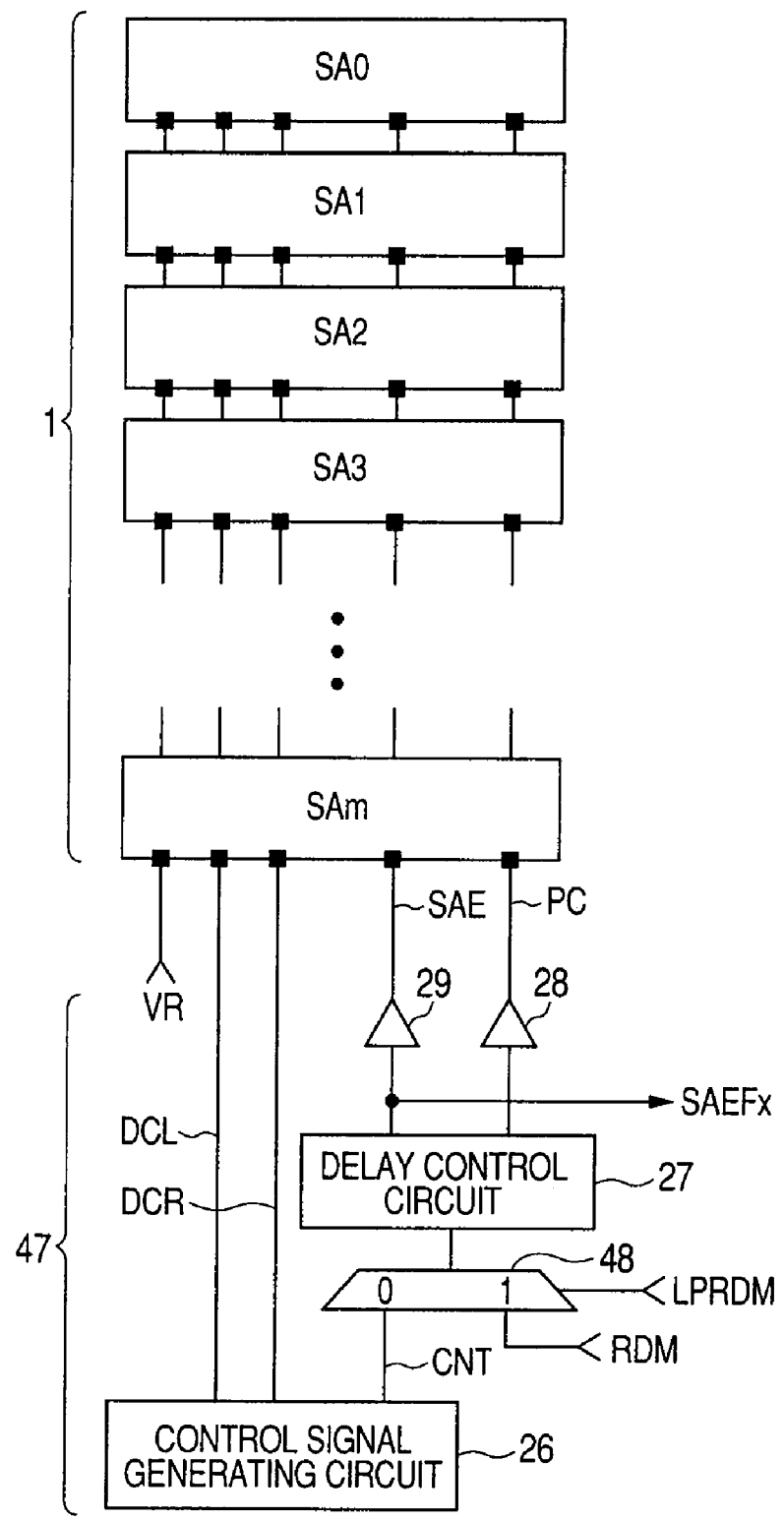
FIG. 7 is a circuit block diagram illustrating a configuration of the sense amplifier control circuit shown in FIG. 5.

FIG. 7 is a circuit block diagram illustrating a configuration of the sense amplifier control circuit 47 corresponding to memory mats MATx (x is 0, 1, 2 or 3), for comparison with FIG. 2. The sense amplifier control circuit 47 of FIG. 7 differs from the sense amplifier control circuit 2 in that a selector 48 is added thereto. The selector 48 receives a signal CNT generated by the control signal generating circuit 26 and a signal RDM generated by the read control circuit 46, and provides the signal CNT to the delay control circuit 27 if the external control signal LPRDM is at "L", and provides the signal RDM to the delay control circuit 27 if the external control signal LPRDM is at "H".

Therefore, the precharge signal PC and the sense amplifier activation signal SAE are generated in response to the signal CNT in the normal read operation mode, whereas the precharge signal PC and the sense amplifier activation signal SAE are generated in response to the signal RDM in the low-speed read operation mode. The signal input to the buffer 29 is fed back to the read control circuit 46 as signals SAEFx (x is 0, 1, 2 or 3).

Figure 8:
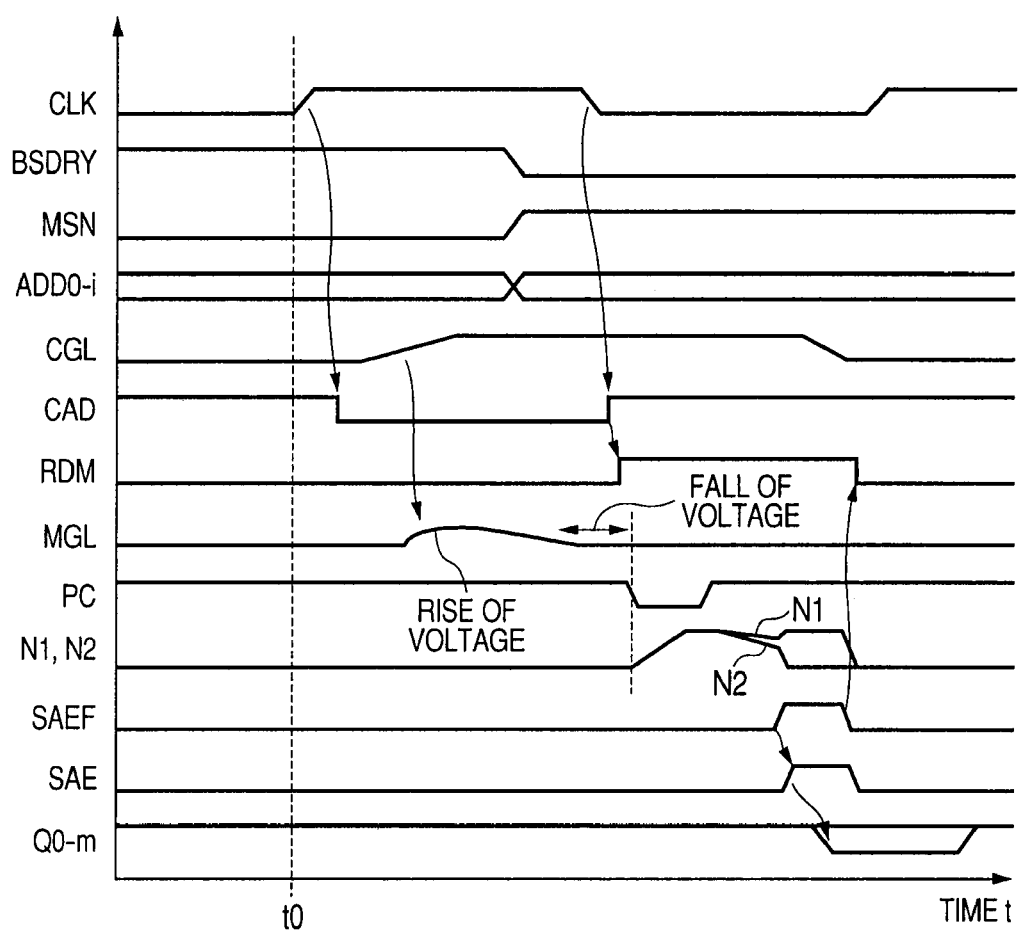
FIG. 8 is a time chart illustrating a low-speed read operation of the flash memory shown in FIGS. 5 to 7.

FIG. 8 is a time chart illustrating an operation in the low-speed read mode of the flash memory. In FIG. 8, it is determined that a read operation is requested when the external control signal BSDRY is set to "H" and the external control signal MSN is set to "L" at the leading edge of the clock signal CLK, and whereby external address signals ADD0 to ADDi are taken in and the read operation is started (time t0).

The control gate line CGL specified by the external address signals ADD0 to ADDi rises to "H" and the signal CAD falls to "L". When the clock signal CLK falls from "H" to "L", the signal CAD rises to "H" and the signal RDM rises to "H". Control of each sense amplifier SA corresponding to the control gate line CGL is thereby started. First, the precharge signal PC is set to "L" for a predefined time period, and the nodes N1 and N2 as well as the selected two bit lines BL are charged up to the power supply voltage Vdd.

Next, difference of voltage occurs between the nodes N1 and N2 with a polarity according to the logic of the data stored in the selected memory cell MC. Subsequently, the sense amplifier activation signal SAE is set to "H" for a predefined time period, and the difference of voltage between the output nodes N1 and N2 is amplified by the amplifier 41 up to the power supply voltage Vdd. For example, the voltage of the output node N1 is provided to the output buffer 25 as the read data signal Q. The output buffer 25 outputs the (m+1)-bit data signals Q0 to Qm from the selected memory mat MAT to the outside. In addition, the signal RDM falls to "L" in response to the trailing edge of the signal SAEF.

In addition, the external control signal LPRDM is set to "L" in the normal read mode. In this case, the switch 45 provides a high voltage Vpp to the buffer 20, the buffer 20 provides the high voltage Vpp to the gate of the transistor 6, and the resistance value of the transistor 6 is set to a low level. The output signal of the gate circuit 60 in FIG. 6 is fixed to "L" whereas the signal RDM is fixed to "H". In the sense amplifier control circuit 47 of FIG. 7, the signal CNT is provided to the delay control circuit 27 via the selector 48. In the normal read mode, therefore, the flash memory of the embodiment 1 has the same configuration as that of the flash memory of FIG. 1.

Similarly in this flash memory, coupling capacitance 7 exists between the adjacent control gate line CGL and the memory gate line MGL, as shown in FIG. 5. Therefore, noise (rise of voltage) is generated in the memory gate line MGL via the coupling capacitance 7 when the control gate line CGL rises to "H", as shown in FIG. 8. In addition, the gate voltage of the transistor 6 is the external power supply voltage VCC in the low-speed read mode, and because the resistance value of the transistor 6 is higher than that of the flash memory of FIG. 1, also the noise that is generated in the memory gate line MGL becomes large.

In the embodiment 1, however, there is approximately an allowance of a half cycle from raising the control gate line CGL to "H" to performing precharge, because the precharge starts in response to the trailing edge of the clock signal CLK. In the low-speed read mode, frequency of the clock signal CLK is sufficiently low and there is noise dissipation time of a half cycle=500 ns if the frequency is 1 MHz, for example. Depending on the frequency in the normal read operation, the above-mentioned time is generally sufficient to cancel the rise of voltage of the memory gate line MGL. As a result, current that reflects the original storage state of the memory cell MC can flow in the memory cell MC, allowing data to be read accurately. Additionally, consumption current in the charge pump circuit 17 can be reduced in the low-speed read mode, because generation of the high voltage Vpp is not required.

It is also conceivable to provide a delay circuit that delays the precharge operation in the low-speed read mode more sufficiently than the normal read mode time in order to cancel the rise of voltage of the memory gate line MGL. However, the chip area increases by disposing a delay circuit in each sense amplifier band 1 because the delay circuit is large in size. With the present invention, on the contrary, the chip area can be small because it is not necessary to provide such a delay circuit.

[Embodiment 2]

Figure 9:
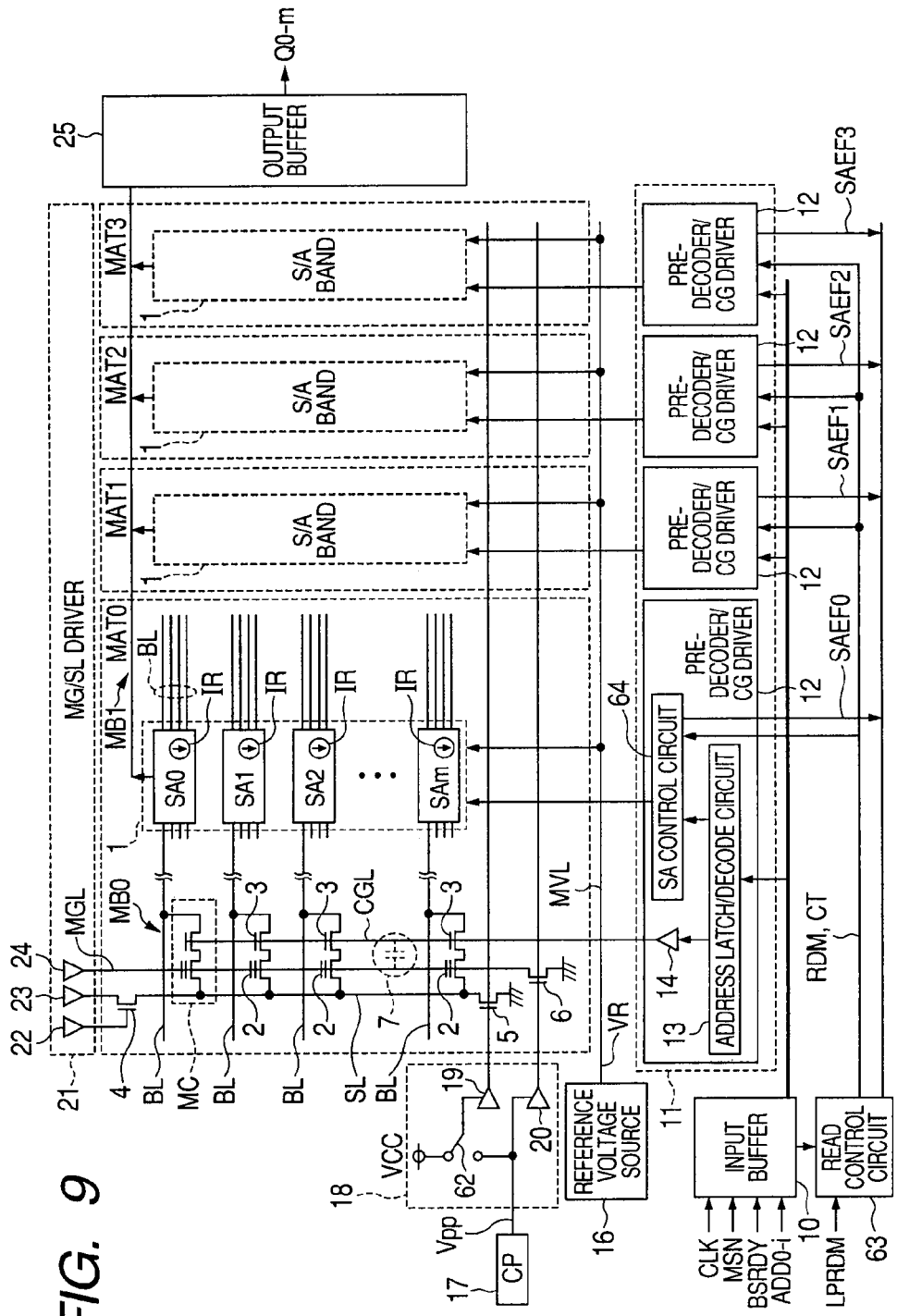
FIG. 9 is a circuit block diagram illustrating a configuration of a flash memory according to an embodiment 2 of the present invention.

FIG. 9 is a circuit block diagram illustrating a configuration of the flash memory according to the embodiment 2 of the present invention, for comparison with FIG. 1. The flash memory of FIG. 9 differs from the flash memory of FIG. 1 in that a switch 62 is added to the MG/SL control circuit 18, a read control circuit 63 is added, and the sense amplifier control circuit 15 is replaced by a sense amplifier control circuit 64.

The switch 62 provides a high voltage Vpp to the buffer 19 in the normal read mode and provides an external power supply voltage VCC to the buffer 19 in the low-speed read mode. Here, the power supply voltage Vdd may be a voltage to which the external power supply voltage VCC is lowered, or a voltage supplied from the outside and is lower than the external power supply voltage VCC.

Figure 10:
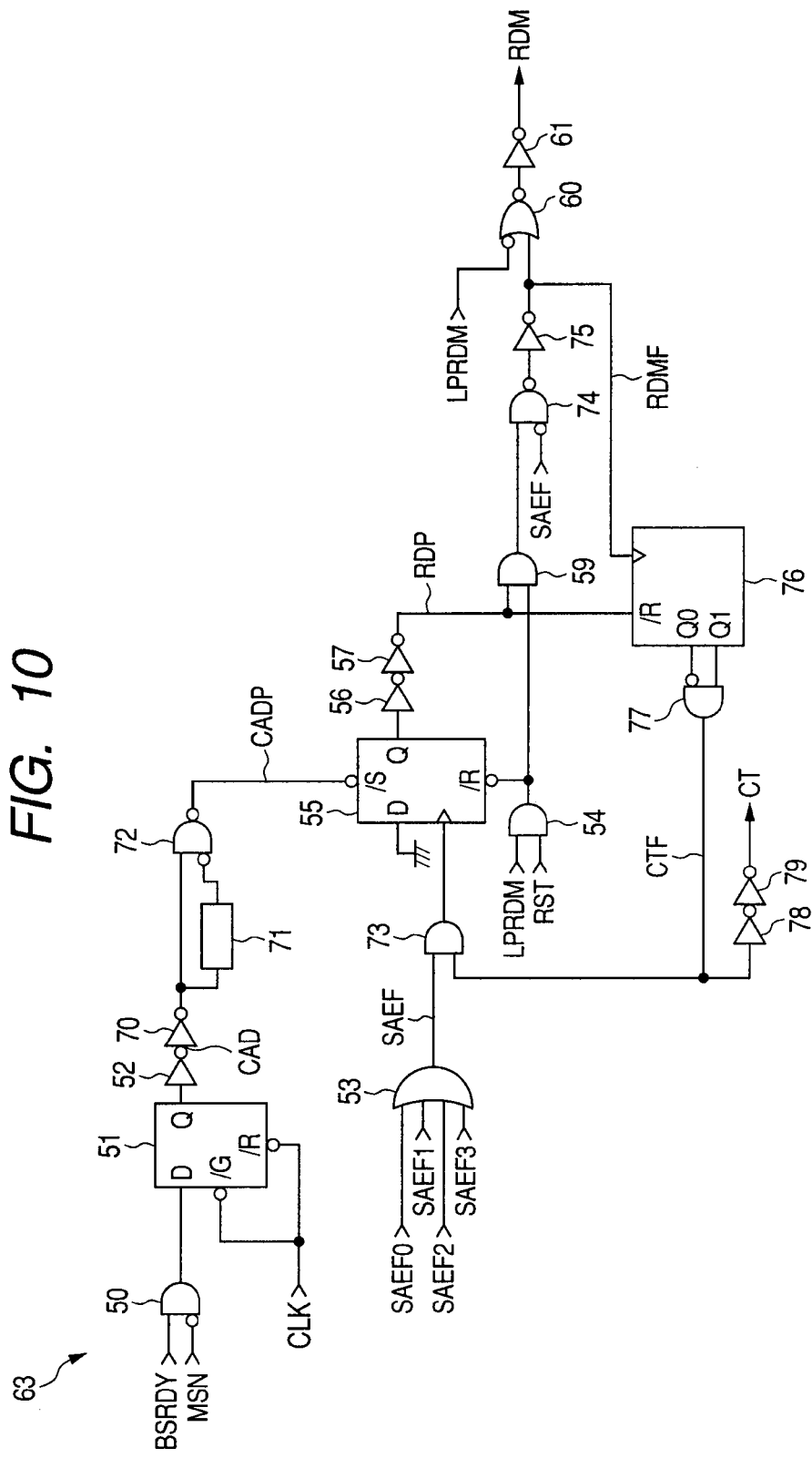
FIG. 10 is a circuit block diagram illustrating a configuration of the read control circuit shown in FIG. 9.

FIG. 10 is a circuit block diagram illustrating a configuration of the read control circuit 63, for comparison with FIG. 6. In FIG. 10, the read control circuit 63 has inverters 70, 75, 78 and 79, a delay circuit 71, gate circuits 72, 74 and 77, an AND gate 73, and a counter 76 added to the read control circuit 46, and the AND gate 58 removed therefrom.

The inverter 70, the delay circuit 71, and the gate circuit 72 compose a pulse generating circuit, which outputs a signal CADP that turns to "L" for the delay time of the delay circuit 71 in response to the trailing edge of the signal CAD. The signal CADP is input to the set terminal (/S) of the flip-flop 55. The output signal of the flip-flop 55 is delayed by the inverters 56 and 57 to be a signal RDP. The signal RPD is input to the other input terminal of the AND gate 59 and is also input to the reset terminal (/R) of the counter 76.

The gate circuit 74 and the inverter 75 generate the logical product signal RDMF of the output signal of the AND gate 59 and the inverted signal of the signal SAEF. The signal RDMF is input to the gate circuit 60 and is also input to the clock terminal of the counter 76.

The counter 76 counts the number of leading edges of the signal RDMF and outputs 2-bit signals Q0 and Q1 indicating the count value. When the signal RDP falls to "L", the output signals Q0 and Q1 of the counter 76 are reset to 0 and 0. The gate circuit 77 outputs the logical product signal CTF of the inverted signal of the signal Q0 and the signal Q1. The signal CTF turns to "H" only when the signals Q0 and Q1 are 0 and 1, and turns to "L" otherwise.

The AND gate 73 provides the logical product signal of the signal SAEF and the signal CTF to the clock terminal of the flip-flop 55. The flip-flop 55 outputs the input signal ("L" level) when the output signal of the AND gate 73 rises to "H". The signal CTF is delayed by the inverters 78 and 79 to be a signal CT. The signals CT and RDM are input to each sense amplifier control circuit 64.

Figure 11:
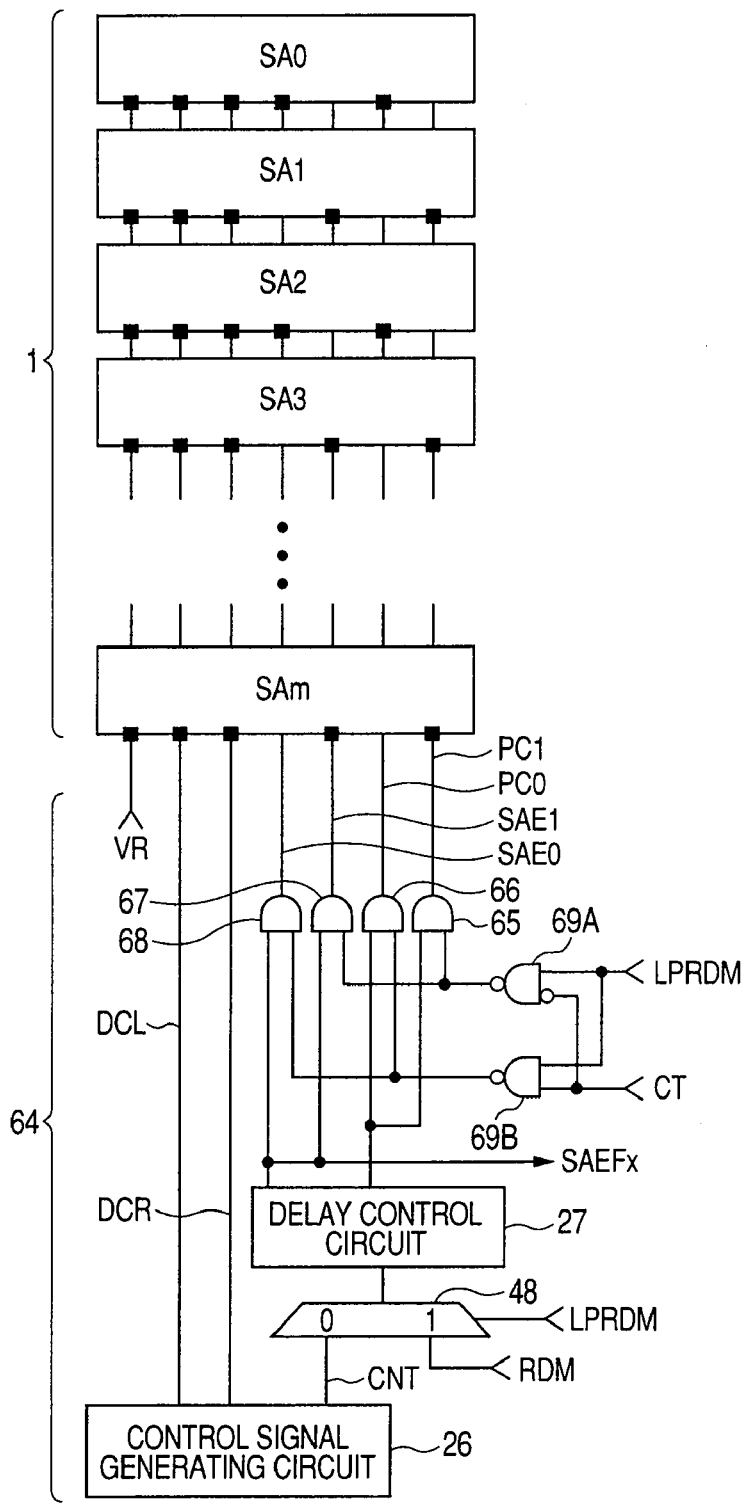
FIG. 11 is a circuit block diagram illustrating a configuration of the sense amplifier control circuit shown in FIG. 9.

FIG. 11 is a circuit block diagram illustrating a configuration of the sense amplifier control circuit 64, for comparison with FIG. 7. The sense amplifier control circuit 64 of FIG. 11 differs from the sense amplifier control circuit 47 in that the buffer 28 is replaced by AND gates 65 and 66, the buffer 29 is replaced by AND gates 67 and 68, and a gate circuit 69A and an AND gate 69B are added.

When the signal LPRDM is at "L", the output signals of the gate circuit 69A and the AND gate 69B both rise to "H" regardless of the logic level of the signal CT, and the AND gates 65 to 68 respectively output precharge signals PC1 and PC0, and sense amplifier activation signals SAE1 and SAE0. When the signal LPRDM is at "H", the gate circuit 69A provides the signal CT to one of the input nodes of the AND gates 65 and 67, whereas the AND gate 69B provides the inverted signal of the signal CT to one of the input nodes of the AND gates 66 and 68.

When the signal LPRDM is at "H" and the signal CT is at "L", the AND gates 66 and 68 respectively output the precharge signal PC0 and the sense amplifier activation signal SAE0. When the signal LPRDM is at "H" and the signal CT is at "H", the AND gates 65 and 67 respectively output the precharge signal PC1 and the sense amplifier activation signal SAE1. The signals PC0 and SAE0 are provided to even-numbered sense amplifiers SA0, SA2, . . . , and SA(m−1). The signals PC1 and SAE1 are provided to the odd-numbered sense amplifiers SA1, SA3, . . . , and SAm.

Figure 12:
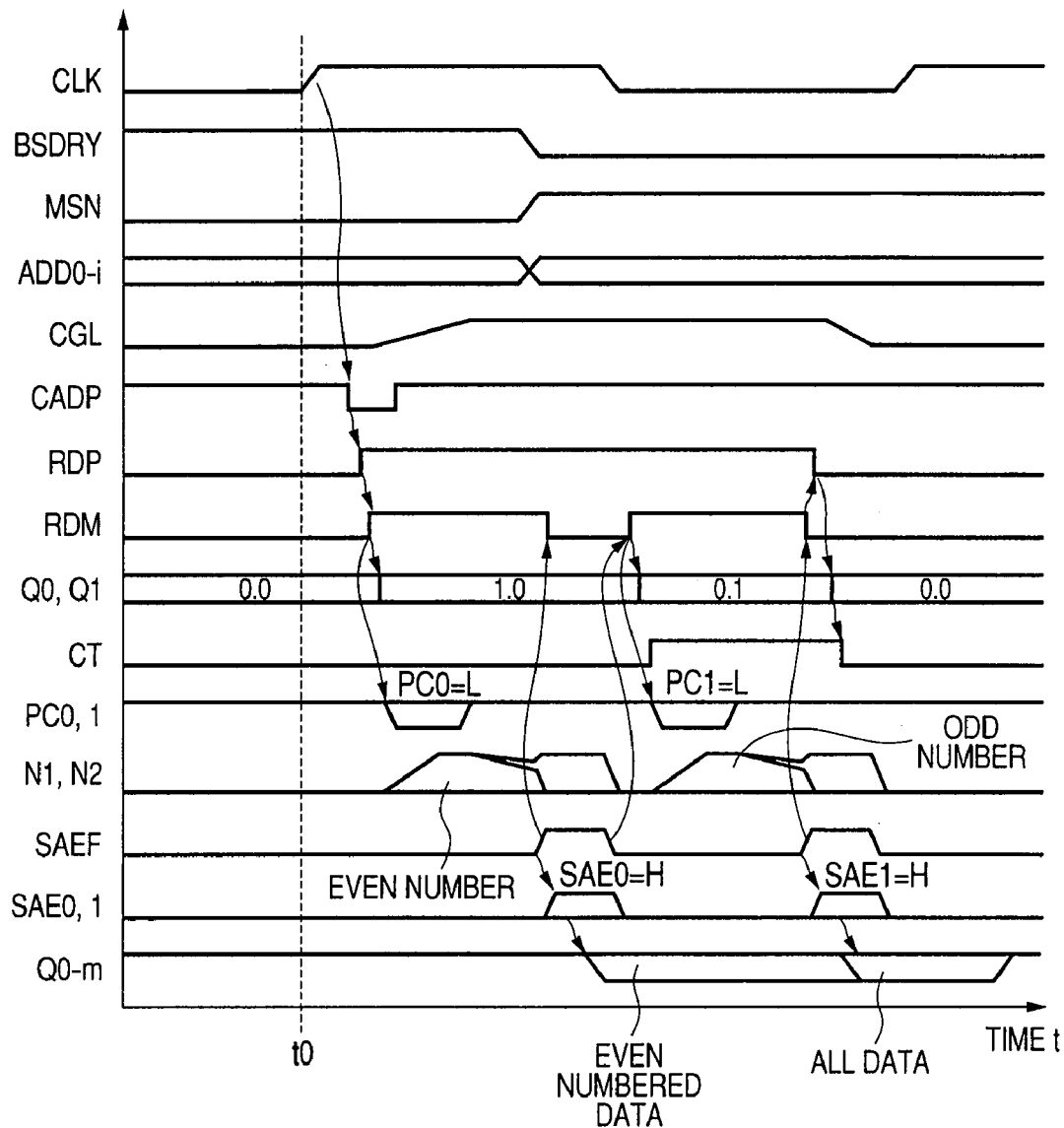
FIG. 12 is a time chart illustrating a low-speed read operation of the flash memory shown in FIGS. 9 to 11.

FIG. 12 is a time chart illustrating an operation in the low-speed read mode of this flash memory. In FIG. 12, it is determined that a read operation is requested when the external control signal BSDRY is set to "H" and the external control signal MSN is set to "L" at the leading edge of the clock signal CLK, and whereby external address signals ADD0 to ADDi are taken in and the read operation is started (time t0).

The control gate line CGL specified by the external address signals ADD0 to ADDi rises to "H" and the signal CADP falls to "L". When the signal CADP falls to "L", the flip-flop 55 is set and the signal RDP rises to "H". When the signal RDP rises to "H", the signal RDM rises to "H" and the count value of the counter 76 is incremented by +1, thereby setting the signals Q0 and Q1 to 1 and 0 respectively. In this case, the signal CT is maintained at "L" level.

When the signal RDM rises to "H", the precharge signal PC0 falls to "L" for a predefined time period and subsequently the signal SAEF and the sense amplifier activation signal SAE0 rise to "H" for a predefined time period, then the data read operation is performed in the even-numbered sense amplifiers SA0, SA2, . . . , and SA(m−1).

When the signal SAEF rises to "H" for a predefined time period, the output signal of gate circuit 74 falls to "L" for a predefined time period, and the signals RDMF and RDM fall to "L" for a predefined time period. When the signal RDMF rises to "H", the count value of the counter 76 is incremented by +1, whereby the signals Q0 and Q1 are set to 0 and 1, respectively, and the signal CT turns to "H" level.

When the signal RDM rises to "H", the precharge signal PC1 falls to "L" for a predefined time period and subsequently the signal SAEF and the sense amplifier activation signal SAE1 rise to "H" for a predefined time period, and then the data read operation is performed in the odd-numbered sense amplifiers SA1, SA3, . . . , and SAm. Accordingly, data signals Q0 to Qm are output from all of the sense amplifiers SA1 to SAm.

When the signal SAEF rises to "H", the signal RDM falls to "L" and the input signal ("L" level) of the flip-flop 55 is output, thereby setting the signal RDP to "L" and resetting the counter 76.

In the low-speed read mode with the embodiment 2, the external power supply voltage VCC is applied to the gate of the transistor 5 instead of the high voltage Vpp, and a read operation is first performed in the even-numbered sense amplifiers SA0, SA2, . . . , and SA (m−1) and subsequently another read operation is performed in odd-numbered sense amplifiers SA1, SA3, . . . , and SAm. Although rise of voltage of the source line SL occurs in each of the two read operations, the amount of charge that is discharged to the source line SL is half compared to the case of completing the read operation in a single iteration. Therefore, rise of the voltage of the source line SL is equal to or lower than the case of completing the read operation in a single iteration, even if the resistance value of the transistor 5 becomes high by providing the external power supply voltage VCC to the gate of the transistor 5. In addition, consumption current of the charge pump circuit 17 can be reduced because it does not generate the high voltage Vpp in the low-speed read mode.

Although the access time from the leading edge of the clock signal CLK seems to be delayed due to the divided read operation, delay of access time will not be a problem because the operating frequency is allowed to be low in the low-speed read mode. Furthermore, only a required minimum number of points (from the bit line BL to the sense amplifier SA) are operated multiple times, and thus increase of the alternate current component of the read current can also be minimized.

Although the read operation is performed in two stages with the embodiment 2, it may be performed in three or more stages.

[Embodiment 3]

Figure 13:
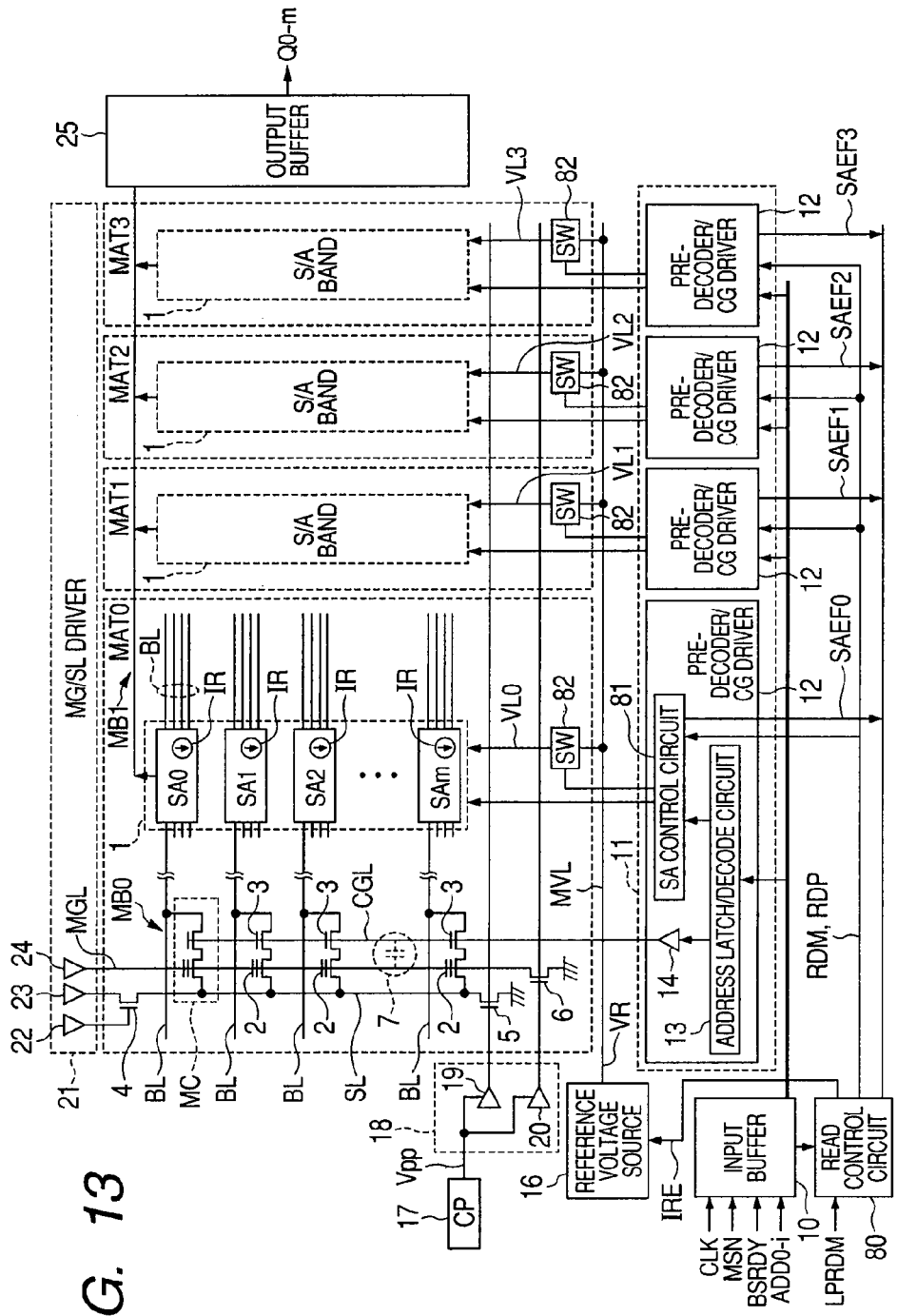
FIG. 13 is a circuit block diagram illustrating a configuration of a flash memory according to an embodiment 3 of the present invention.

FIG. 13 is a circuit block diagram illustrating a configuration of the flash memory according to the embodiment 3 of the present invention, for comparison with FIG. 1. The flash memory of FIG. 13 differs from the flash memory of FIG. 1 in that the reference voltage source 16 is controlled by a signal IRE, a read control circuit 80 is added, the sense amplifier control circuit 15 is replaced by a sense amplifier control circuit 81, and a switch (SW) 82 is added to each memory mat MAT. The reference voltage source 16 is activated to generate the reference voltage VR when the signal IRE is at "H", and is deactivated when the signal IRE is at "L".

In addition, a main voltage line MVL common to the four memory mats MAT0 to MAT3 is provided, and sub-voltage lines VL0 to VL3 are provided corresponding to the four memory mats MAT0 to MAT3. One end of the main voltage line MVL receives the output voltage VR of the reference voltage source 16. Each sub-voltage line VL is provided across the sense amplifiers SA0 to SAm of the corresponding sense amplifier band 1. Each switch 82 is coupled between one end of the corresponding sub-voltage line VL and the main voltage line MVL. Each switch 82 is controlled by the output signal of the corresponding sense amplifier control circuit 81 and turned into a conduction state when the corresponding memory mat MAT is selected.

Figure 14:
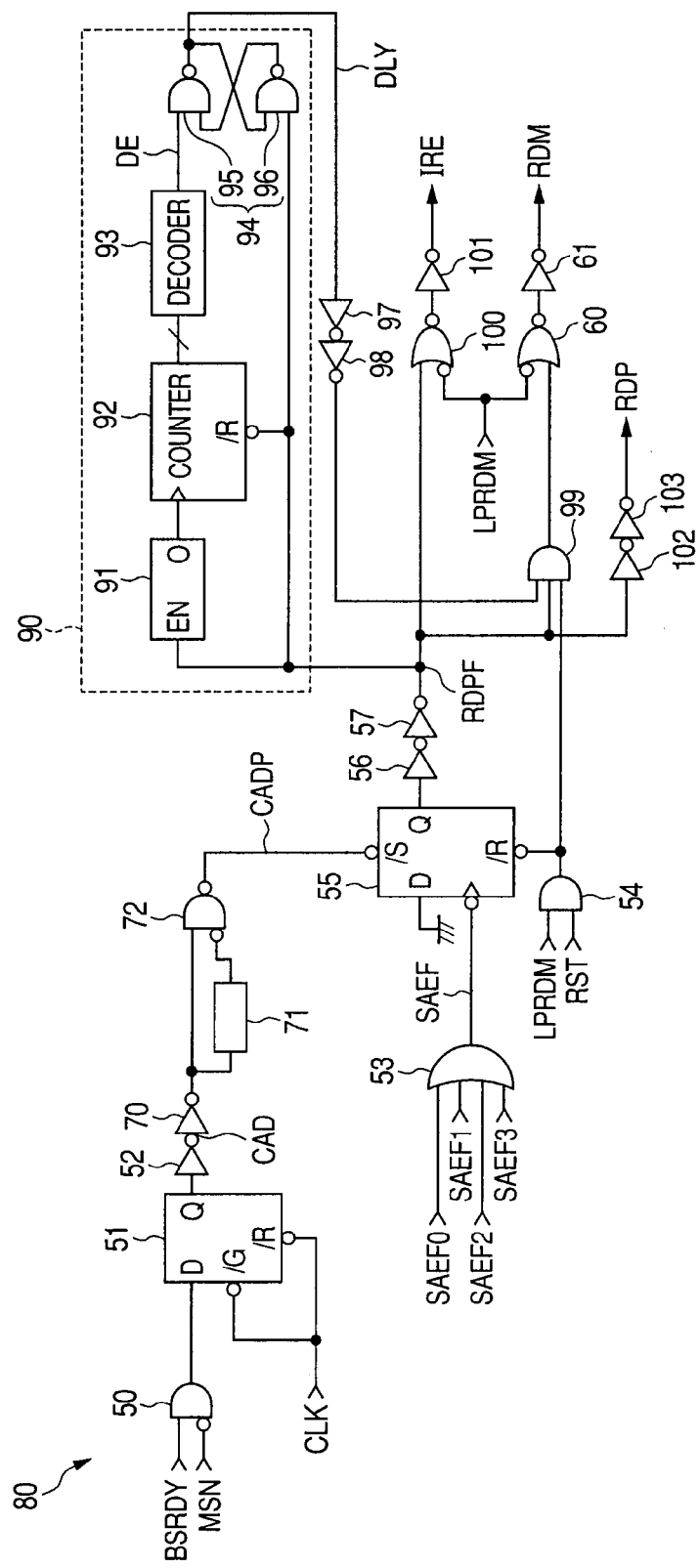
FIG. 14 is a circuit block diagram illustrating a configuration of the read control circuit shown in FIG. 13.

FIG. 14 is a circuit block diagram illustrating a configuration of the read control circuit 80, for comparison with FIG. 6. In FIG. 14, the read control circuit 80 has inverters 70, 97, 98 and 101 to 103, delay circuits 71 and 90, an AND gate 99, and a gate circuit 100 added to the read control circuit 46, and the AND gates 58 and 59 removed therefrom.

The inverter 70, the delay circuit 71, and the gate circuit 72 compose a pulse generating circuit, which outputs a signal CADP that turns to "L" for the delay time of the delay circuit 71 in response to the trailing edge of the signal CAD. The signal CADP is input to the set terminal (/S) of the flip-flop 55. The output signal of the flip-flop 55 is delayed by the inverters 56 and 57 to be the signal RDPF. The signal RDPF is input to the delay circuit 90 and also to the first input terminal of the AND gate 99, and the signal RDPF is delayed by the inverters 102 and 103 to be the signal RDP.

The delay circuit 90 includes a ring oscillator 91, a counter 82, a decoder 93 and a flip-flop 94. The ring oscillator 91 is activated when the signal RDPF is at "H" level and outputs a clock signal having a predefined frequency. The counter 92 counts the number of pulses of the output clock signal of the ring oscillator 91 and outputs a multi-bit signal indicating the count value. In addition, the counter 92 is reset in response to the trailing edge of the signal RDPF. The decoder 93 receives an output signal of the counter 92, and sets the signal DE to "L" when the count value of the counter 92 is a predefined value.

The flip-flop 94, which includes two NAND gates 95 and 96, is set by the trailing edge of the output signal DE of the decoder 93 to set the signal DLY to "H", or reset by the trailing edge of the signal RDPF to set the signal DLY to "L". The signal DLY is delayed by the inverters 97 and 98, and input to the second input terminal of the AND gate 99.

In addition, the output signal of the AND gate 54 is input to the third input terminal of the AND gate 99. The output signal of the AND gate 99 is input to the gate circuit 60 instead of the output signal of the AND gate 59. The gate circuit 100 and the inverter 101 output the logical sum signal IRE of the inverted signal of the signal LPRDM and the signal RDPF. The signal IRE is input to the reference voltage source 16. Since the external control signal LPRDM is set to "L" in the normal read operation mode, the signal IRE is fixed to "H" and the reference voltage source 16 is activated. The signals RDP and RDM are input to each sense amplifier control circuit 82.

Figure 15:
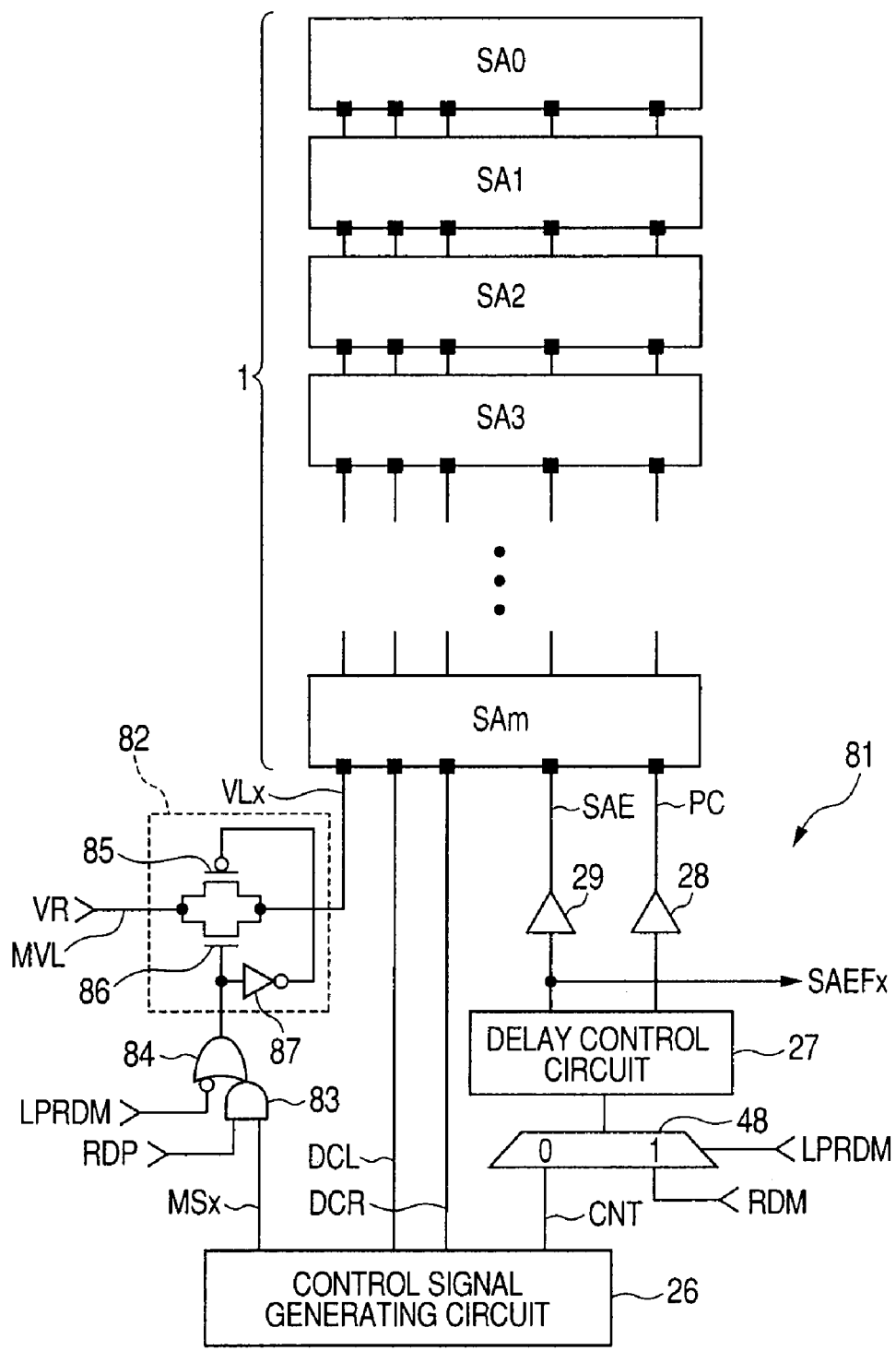
FIG. 15 is a circuit block diagram illustrating a configuration of the sense amplifier control circuit shown in FIG. 13.

FIG. 15 is a circuit block diagram illustrating a configuration of the sense amplifier control circuit 81, for comparison with FIG. 7. The sense amplifier control circuit 64 of FIG. 15 differs from the sense amplifier control circuit 47 in that the mat selection signals MSx (x is 0, 1, 2 or 3) are output from the control signal generating circuit 26, and an AND gate 83 and a gate circuit 84 are added.

The mat selection signal MSx turns to "H" when the mat MATx is selected by the address signals ADD0 to ADDi, and turns to "L" otherwise. The AND gate 83 outputs the logical product signal of the signals MSx and RDP. The gate circuit 84 outputs the logical sum signal of the inverted signal of the signal LPRDM and the output signal of the AND gate 83.

The switch 82 includes a P-channel MOS transistor 85 and an N-channel MOS transistor 86, which are coupled in parallel between the main voltage line MVL and corresponding sub-voltage lines VLx (x is 0, 1, 2, or 3), and an inverter 87. The output signal of the gate circuit 84 is directly input to the gate of the transistor 86, and input to the gate of the transistor 85 via the inverter 87. When the signals LPRDM, RDP, and MSx are all at "H", the transistors 85 and 86 are turned on, and the reference voltage VR is provided to each sense amplifier SA. When the signal LPRDM is at "L", the transistors 85 and 86 are turned on regardless of the signals RDP and MSx, and the reference voltage VR is provided to each sense amplifier SA.

Figure 16:
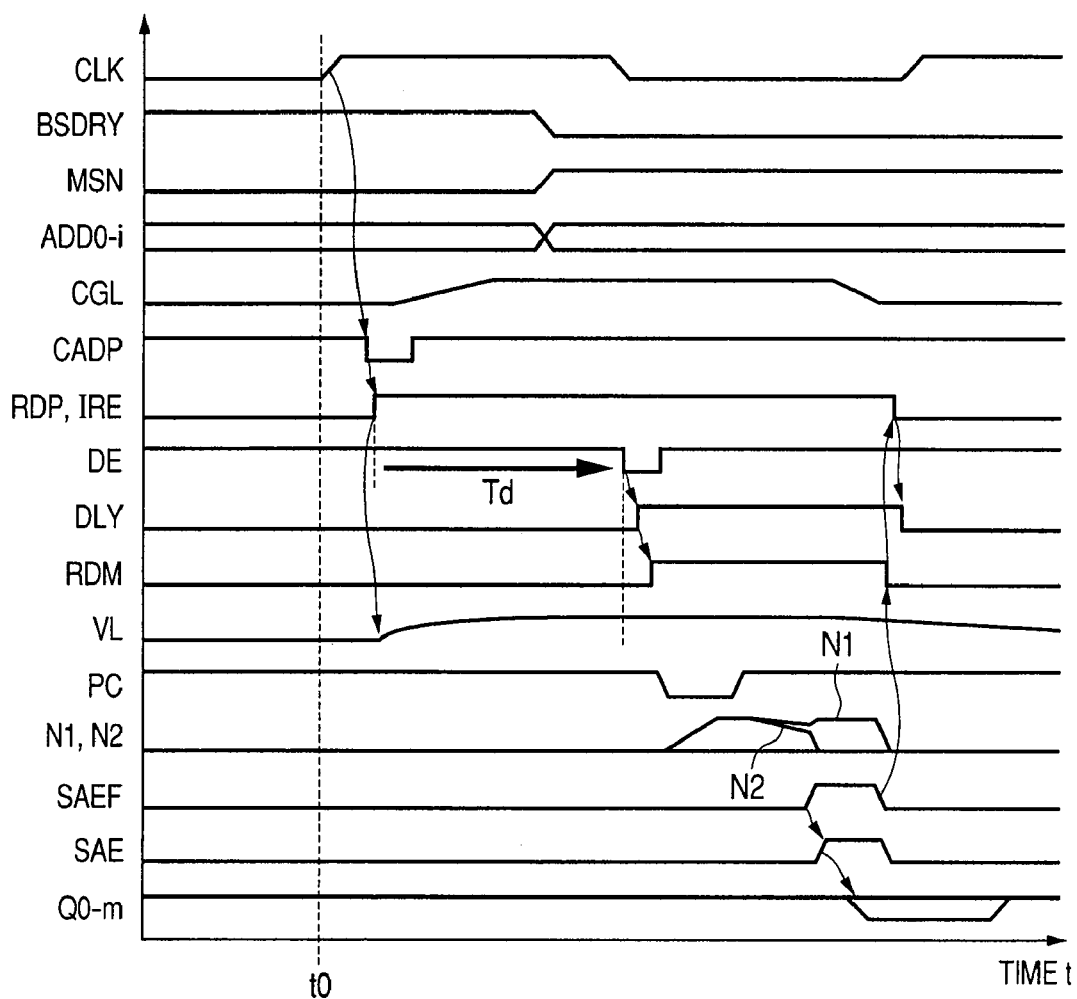
FIG. 16 is a time chart illustrating a low-speed read operation of the flash memory shown in FIGS. 13 to 15.

FIG. 16 is a time chart illustrating an operation in the low-speed read mode of the flash memory. In FIG. 16, it is determined that a read operation is requested when the external control signal BSDRY is set to "H" and the external control signal MSN is set to "L" at the leading edge of the clock signal CLK, and whereby external address signals ADD0 to ADDi are taken in and the read operation is started (time t0).

The control gate line CGL specified by the external address signals ADD0 to ADDi rises to "H" and the signal CADP falls to "L". When the signal CADP falls to "L", the flip-flop 55 is set and the signals RDPF, RDP, and IRE rise to "H". When the signal IRE rises to "H", the reference voltage source 16 is activated. When the signal RDP rises to "H", the switch 82 of the selected memory mat MAT is turned on, and the voltage of sub-voltage line VL corresponding to the switch 82 begins to rise.

When the signal RDPF rises to "H", the ring oscillator 91 is activated and the output signal DE of the decoder 93 falls to "L" for one clock period after a predefined time period Td. The time period Td is preliminarily set as a time required for the voltage of the sub-voltage line VL to be saturated and stabilized. When the signal DE falls to "L", the flip-flop 94 is set and the signals DLY and RDM rise to "H".

When the signal RDM rises to "H", the precharge signal PC falls to "L" for a predefined time period and subsequently the signal SAEF and the sense amplifier activation signal SAE rise to "H" for a predefined time period, then the data read operation is performed in the sense amplifiers SA0 to SAm, and the data signals Q0 to Qm are output. When the signal SAEF falls to "L", the signals RDPF, RDP, IRE, RDM and DLY are reset to "L".

With the embodiment 3, consumption current can be reduced because the reference current IR activates the reference voltage source 16 only for a necessary period of time in the low-speed read mode. However, direct current component may increase if rise of the reference voltage VR is slow, and therefore load of the reference voltage source 16 is reduced (to one fourth in the embodiment 3) by supplying the reference voltage VR only to the selected memory mat MAT, thereby quickening the rise of the reference voltage VR. Because accurate reading may not be performed if the read operation is performed in the middle of the rise of the reference voltage VR, the sense amplifier SA is activated after a predefined time has passed since the rise of the clock signal CLK.

[Embodiment 4]

Figure 17:
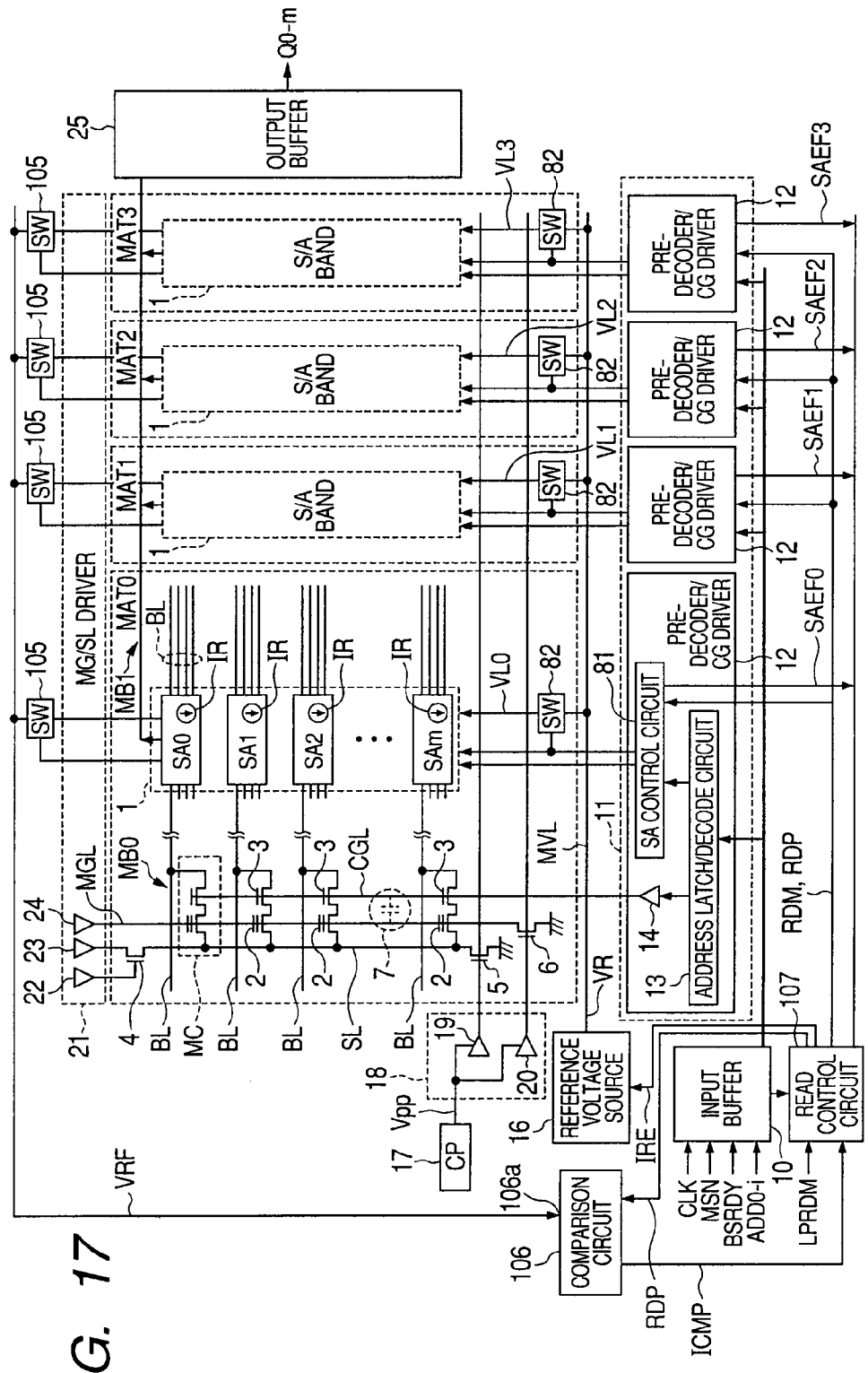
FIG. 17 is a circuit block diagram illustrating a configuration of a flash memory according to an embodiment 4 of the present invention.

FIG. 17 is a circuit block diagram illustrating a configuration of the flash memory according to the embodiment 4 of the present invention, for comparison with FIG. 13. The flash memory of FIG. 17 differs from the flash memory of FIG. 13 in that a switch (SW) 105 is added corresponding to each sub-voltage line VL, a comparison circuit 106 is added, and the read control circuit 80 is replaced by a read control circuit 107. Each switch 105 is coupled between the other end of the corresponding sub-voltage line VL and the input node 106a of the comparison circuit 106, and turned on or off together with the corresponding switch 82.

Figure 18:
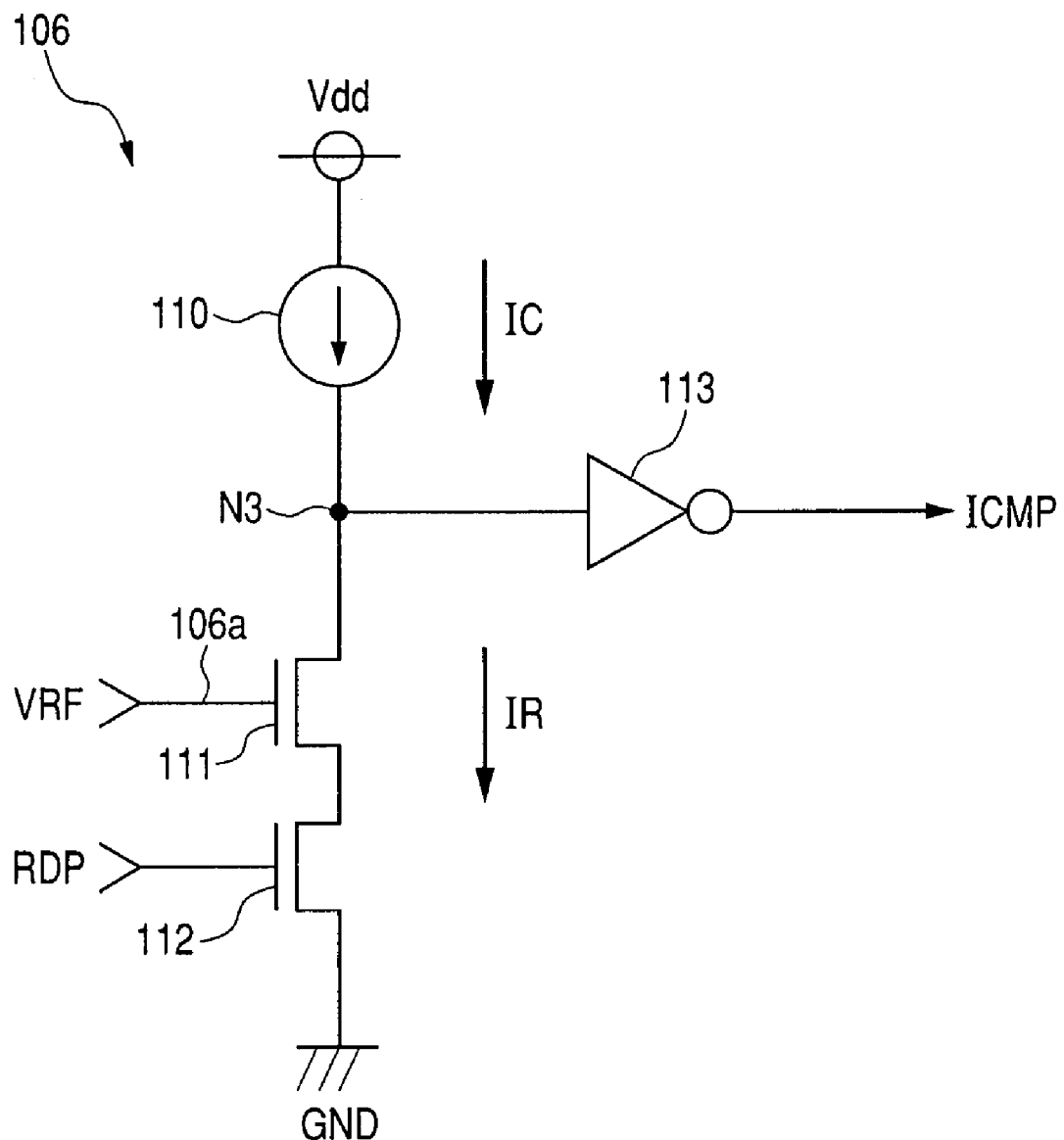
FIG. 18 is a circuit diagram illustrating a configuration of a comparison circuit shown in FIG. 17.

The comparison circuit 106 includes a constant current source 110, N-channel MOS transistors 111 and 112, and an inverter 113, which are serially coupled between the line of the power supply voltage Vdd and the line of the ground voltage GND, as shown in FIG. 18. The constant current source 110 flows constant comparison current IC. The gate (input node 106a of the comparison circuit 106) of the transistor 111 is coupled to the sub-voltage line VL via the switch 105. The gate of the transistor 112 receives the output signal RDP of the read control circuit 107. The inverter 113 sets the signal ICMP to "H" if the voltage of the node N3 between the constant current source 110 and the transistor 111 is lower than the threshold voltage, and sets the signal ICMP to "L" if the voltage of the node N3 is higher than the threshold voltage.

If the voltage VRF of the selected sub-voltage line VL is lower than a predefined voltage during the period in which the signal RDP is at "H", the reference current IR flowing through the transistors 111 and 112 becomes smaller than the comparison current IC, and whereby the level of node N3 turns to "H" and the signal ICMP turns to "L". When the voltage VRF of the selected sub-voltage line VL reaches a predefined voltage, the reference current IR flowing through the transistors 111 and 112 becomes larger than the comparison current IC, and whereby the level of node N3 turns to "L" and the signal ICMP turns to "H". Therefore, the sense amplifier SA can be activated when the signal ICMP turns to "H".

Figure 19:
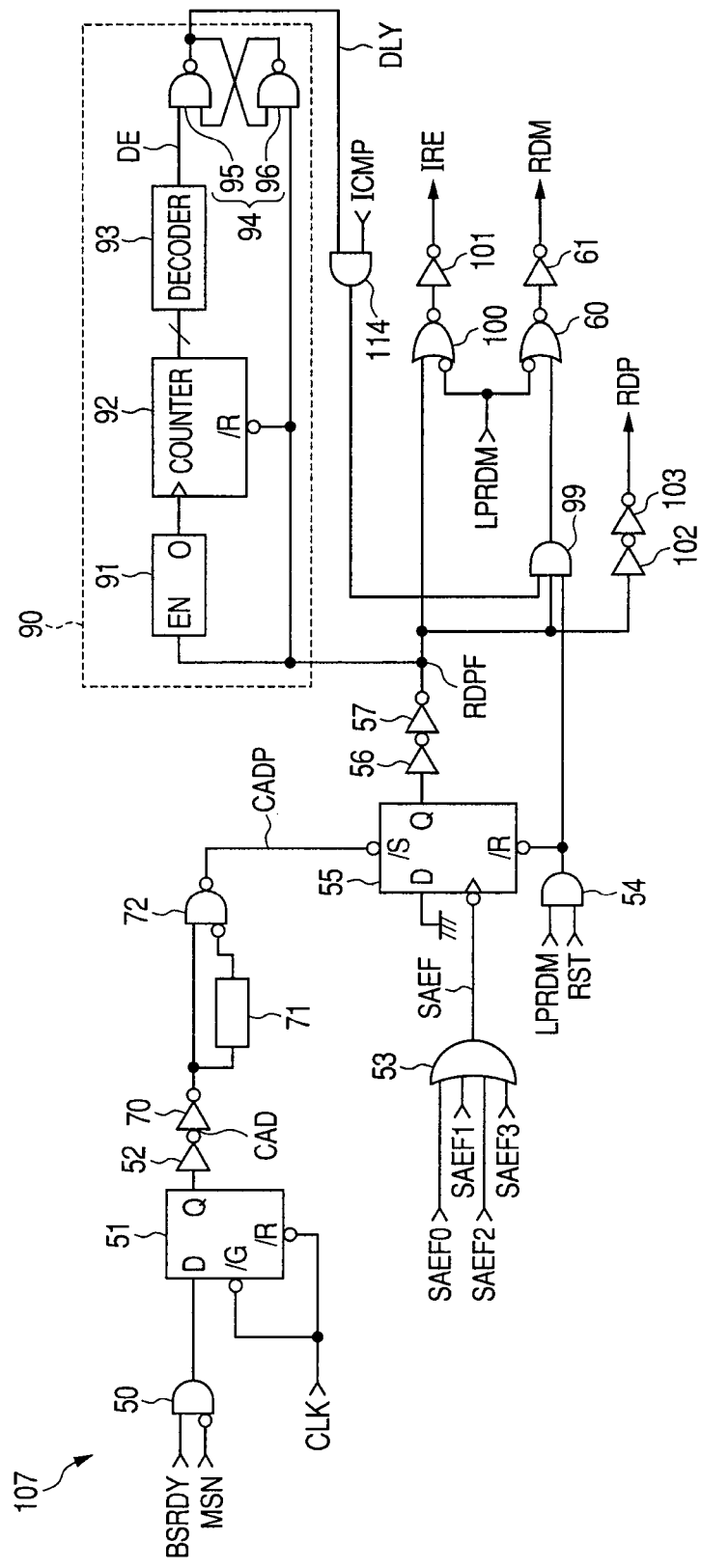
FIG. 19 is a circuit block diagram illustrating a configuration of the read control circuit shown in FIG. 17.

FIG. 19 is a circuit block diagram illustrating a configuration of the read control circuit 107, for comparison with FIG. 14. The read control circuit 107 of FIG. 19 differs from the read control circuit 80 in that the inverters 97 and 98 are replaced by an AND gate 114. The AND gate 114 generates the logical product signal of the output signal DLY of the delay circuit 90 and the output signal ICMP of the comparison circuit 106. Instead of the output signal of the inverter 98, the output signal of the AND gate 114 is input to the AND gate 99.

Figure 20:
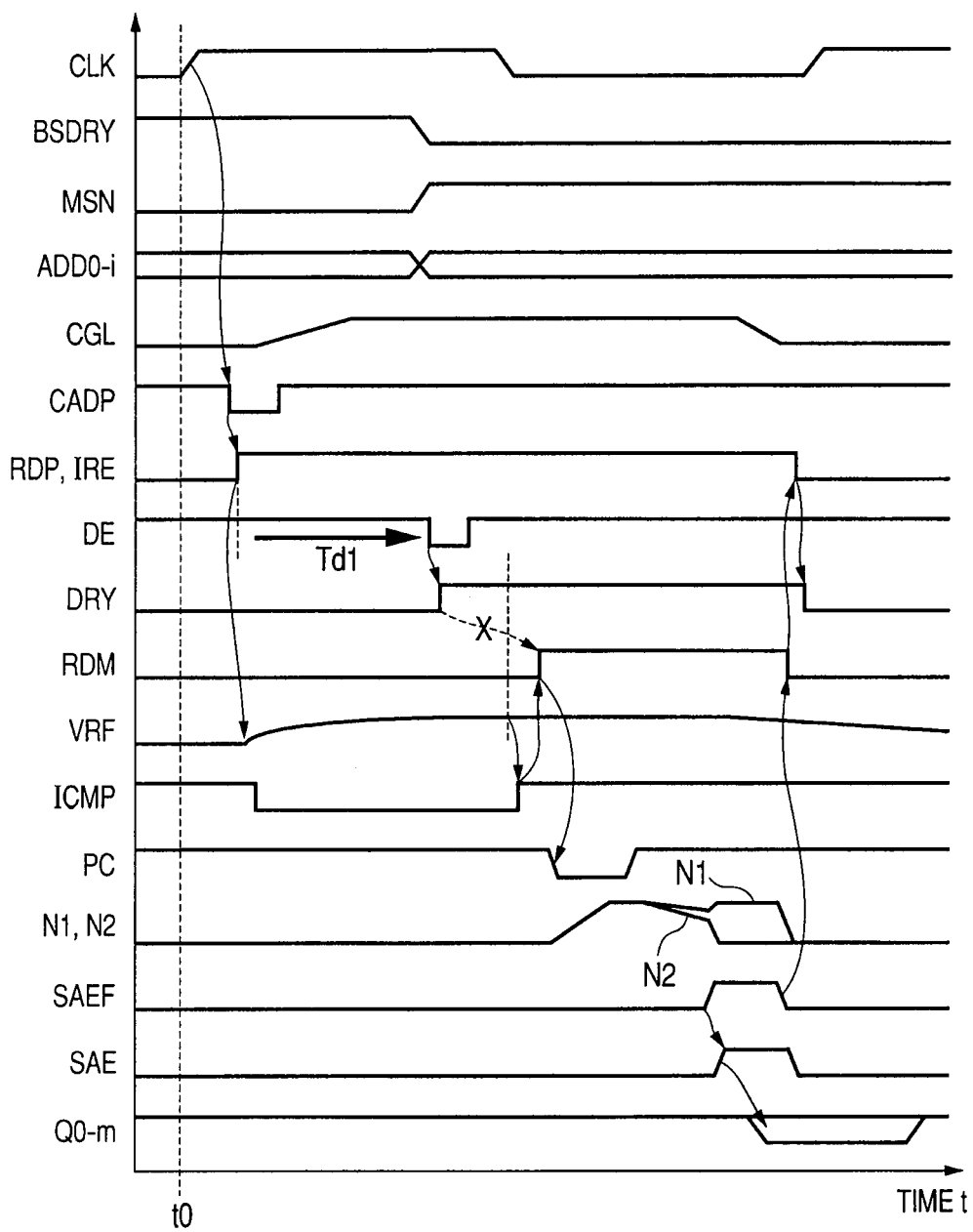
FIG. 20 is a time chart illustrating a low-speed read operation of the flash memory shown in FIGS. 17 to 19.

FIG. 20 is a time chart illustrating an operation in the low-speed read mode of the flash memory. In FIG. 20, it is determined that a read operation is requested when the external control signal BSDRY is set to "H" and the external control signal MSN is set to "L" at the leading edge of the clock signal CLK, and whereby external address signals ADD0 to ADDi are taken in and the read operation is started (time t0).

The control gate line CGL specified by the external address signals ADD0 to ADDi rises to "H" and the signal CADP falls to "L". When the signal CADP falls to "L", the flip-flop 55 is set and the signals RDPF, RDP and IRE rise to "H". When the signal IRE rises to "H", the reference voltage source 16 is activated. When the signal RDP rises to "H", the switches 82 and 105 of the selected memory mat MAT are turned on, and the voltage VRF of sub-voltage line VL corresponding to the switches 82 and 105 begins to rise. In addition, the comparison circuit 106 is activated when the signal RDP rises to "H", whereas the signal ICMP falls to "L" because the voltage VRF is still low.

When the signal RDPF rises to "H", the ring oscillator 91 is activated and the output signal DE of the decoder 93 falls to "L" for one clock period after the predefined time period Td1. The time period Td1 is preliminarily set as a standard time period required for the voltage VRF of the sub-voltage line VL to be saturated and stabilized. When the signal DE falls to "L", the flip-flop 94 is set and the signal DLY rises to "H". Although the signal RDM immediately rises to "H" if the voltage VRF has already risen to a predefined voltage in this occasion, it waits until the voltage VRF reaches a predefined voltage because, in FIG. 20, the voltage VRF has not yet reached a predefined voltage.

When the voltage VRF reaches a predefined voltage, the node N3 of FIG. 18 turns to "L", the signal ICMP rises to "H", and the signal RDM rises to "H". When the signal RDM rises to "H", the precharge signal PC falls to "L" for a predefined time period and subsequently the signal SAEF and the sense amplifier activation signal SAE rise to "H" for a predefined time period, then the data read operation is performed in the sense amplifiers SA0 to SAm, and the data signals Q0 to Qm are output. When the signal SAEF falls to "L", the signals RDPF, RDP, IRE, RDM and DLY are reset to "L".

With the embodiment 4, consumption current can be reduced because the reference current IR activates the reference voltage source 16 only for a necessary period of time in the low-speed read mode. However, direct current component may increase if rise of the reference voltage VR is slow, and therefore load of the reference voltage source 16 is reduced (to one fourth in the embodiment 4) by supplying the reference voltage VR only to the selected memory mat MAT, thereby quickening the rise of the reference voltage VR.

Because accurate reading may not be performed if the read operation is performed in the middle of the rise of the reference voltage VR, the sense amplifier SA is activated after the reference voltage VR has reached a predefined voltage. That is, although the reference voltage VR usually rises to a sufficient level within the delay time Td1 of the delay circuit 90, there is a possibility that the reference voltage VR does not rise within the delay time Td1 if the manufacturing process, the power supply voltage, or the temperature fluctuated beyond the assumed range. With the embodiment 4, accurate read operation can be performed even in such a case.

Although a case has been described with the embodiment 4 that uses one type of reference voltage source 16, the sense amplifier SA may be activated after each of the plurality of types of reference voltages reached a predefined voltage, when a plurality of types of reference voltage sources is used.

Figure 21:
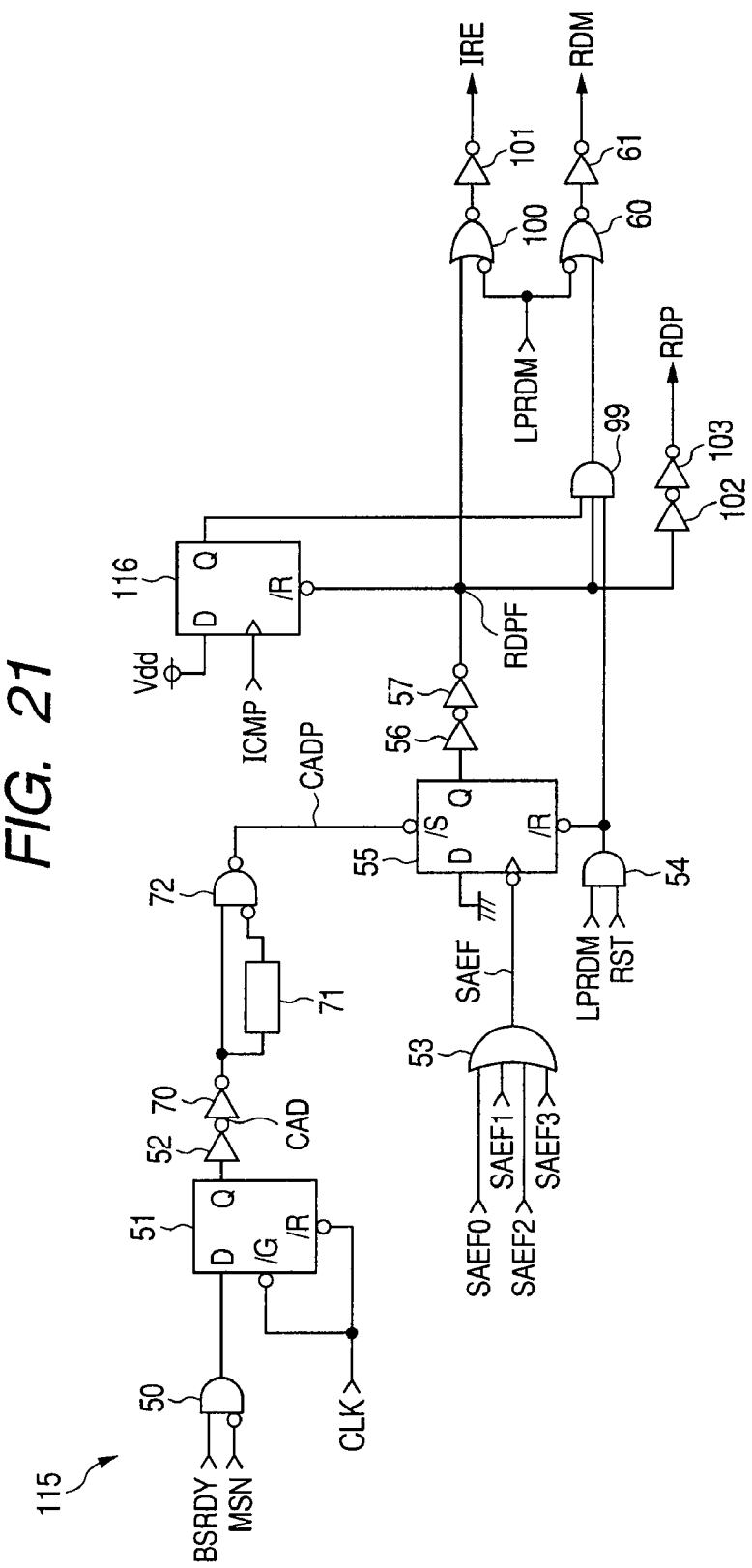
FIG. 21 is a circuit block diagram illustrating an exemplary modification of the embodiment 4.

FIG. 21 is a circuit block diagram illustrating an exemplary modification of the embodiment 4, for comparison with FIG. 19. In the flash memory of FIG. 21, the read control circuit 107 is replaced by a read control circuit 116. The read control circuit 116 has the delay circuit 90 and the AND gate 114 of the read control circuit 107 replaced by the flip-flop 116.

The power supply voltage Vdd ("H") is applied to the input terminal (D) of the flip-flop 116. Instead of the output signal of AND gate 114, the output signal of the flip-flop 116 is input to the AND gate 99. The signal ICMP is input to the clock terminal of the flip-flop 116, and the signal RDPF is input to the reset terminal (/R) of the flip-flop 116. When the signal ICMP rises to "H" from "L", the output signal of the flip-flop 116 turns to "H". In this exemplary modification, therefore, sense amplifier SA is always activated after the reference voltage VR has reached a predefined voltage, regardless of the delay time Td1 of the delay circuit 90.

[Embodiment 5]

Figure 22:
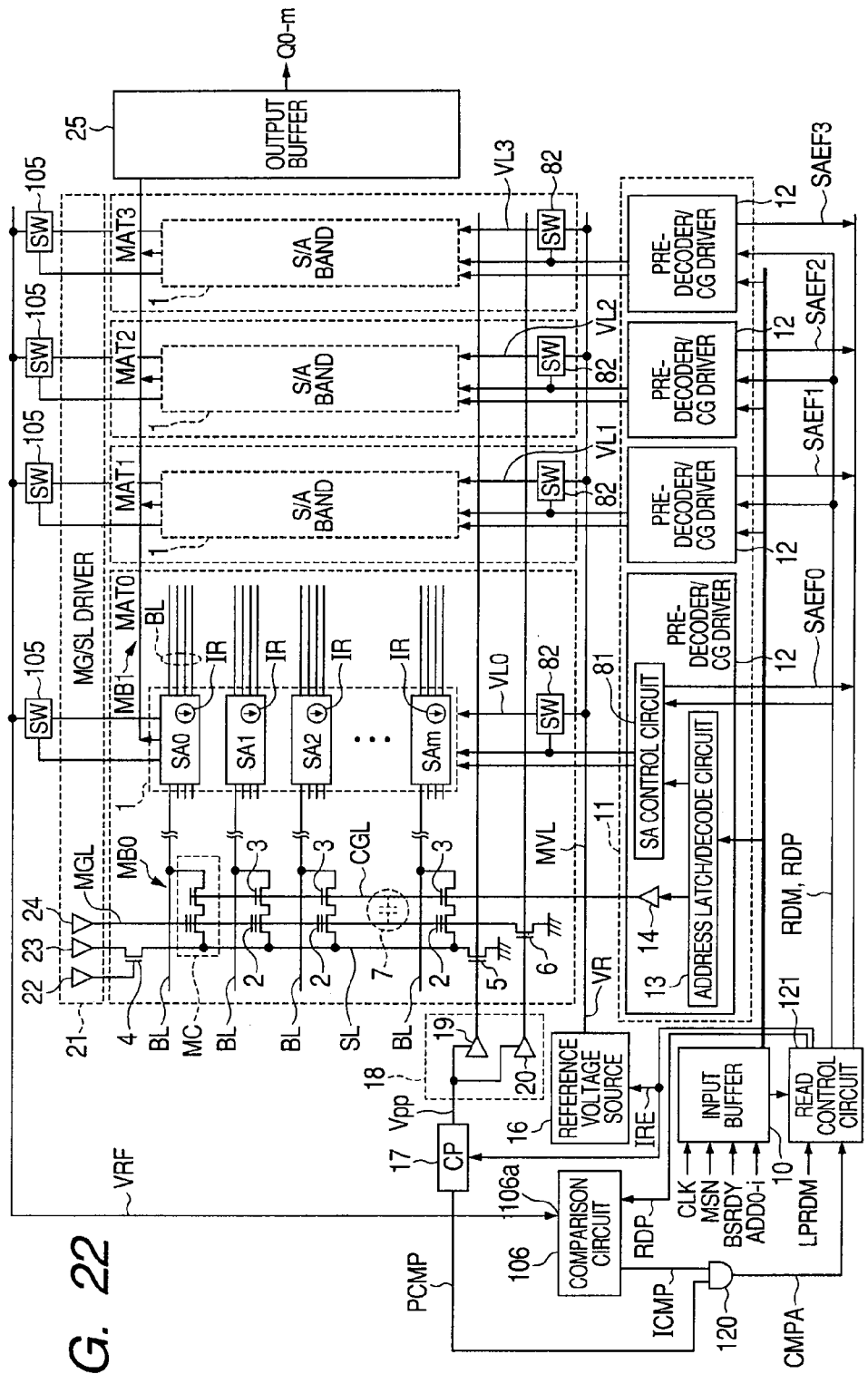
FIG. 22 is a circuit block diagram illustrating a configuration of a flash memory according to an embodiment 5 of the present invention.

FIG. 22 is a circuit block diagram illustrating a configuration of the flash memory according to the embodiment 5 of the present invention, for comparison with FIG. 17. The flash memory of FIG. 22 differs from the flash memory of FIG. 17 in that the charge pump circuit 17 is controlled by the signal IRE, an AND gate 120 is added, and the read control circuit 107 is replaced by a read control circuit 121.

Similarly with the reference voltage source 16, the charge pump circuit 17 is activated when the signal IRE is at "H" and deactivated when the signal IRE is at "L". In addition, the charge pump circuit 17 sets the signal PCMP to "L" when the high voltage Vpp is lower than the target voltage, and sets the signal PCMP to "H" when the high voltage Vpp reaches the target voltage. The AND gate 120 provides the logical product signal CMPA of the output signal PCMP of charge pump circuit 17 and the output signal ICMP of the comparison circuit 106 to the read control circuit 121.

Figure 23:
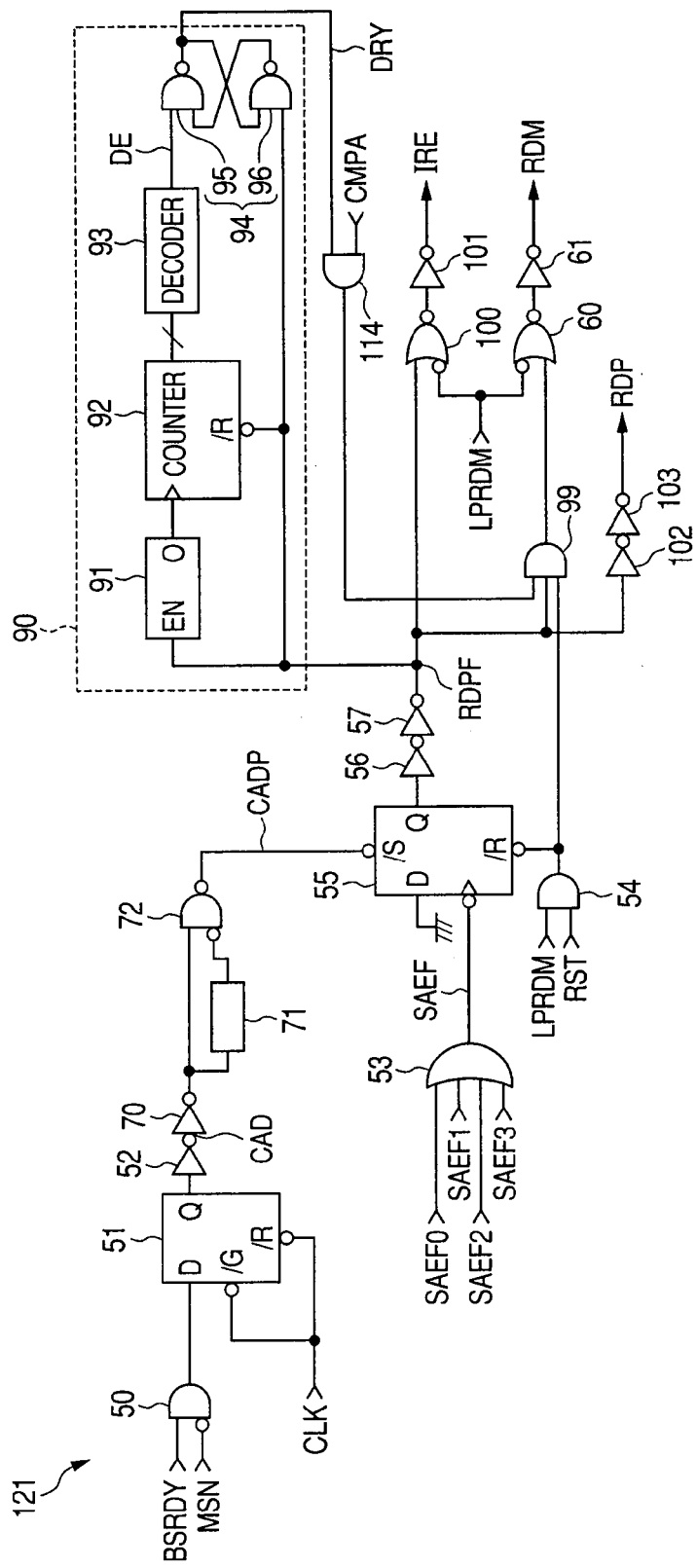
FIG. 23 is a circuit block diagram illustrating a configuration of the read control circuit shown in FIG. 22.

FIG. 23 is a circuit block diagram illustrating a configuration of read control circuit 121, for comparison with FIG. 19. The read control circuit 121 of FIG. 23 differs from the read control circuit 107 in that the signal CMPA is input to the AND gate 114 instead of the signal ICMP. Therefore, the signal RDM rises to "H" after the high voltage Vpp reached the target voltage and the reference voltage VR reached a predefined voltage.

Figure 24:
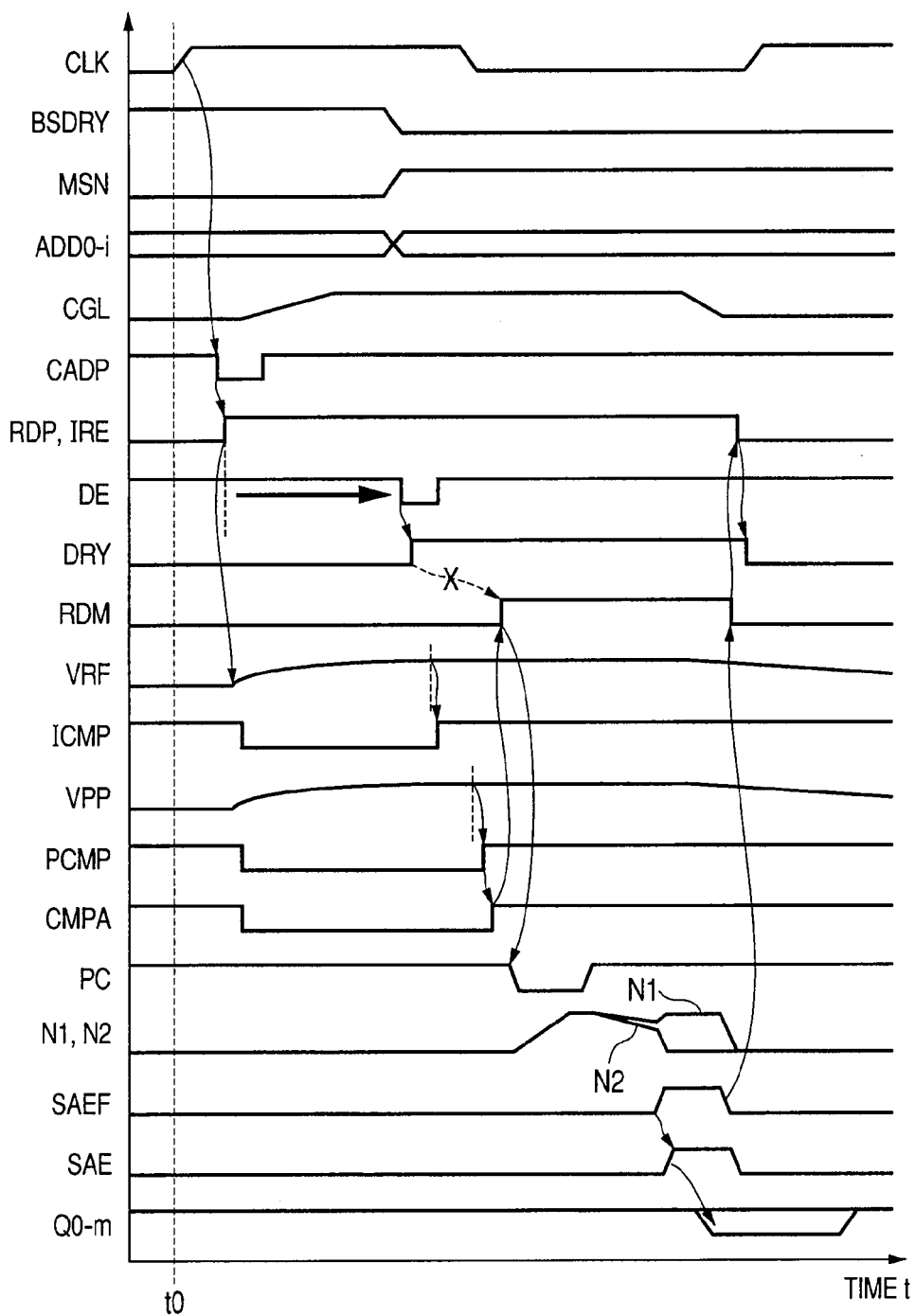
FIG. 24 is a time chart illustrating a low-speed read operation of the flash memory shown in FIGS. 22 and 23.

FIG. 24 is a time chart illustrating an operation in the low-speed read mode of the flash memory. In FIG. 24, it is determined that a read operation is requested when the external control signal BSDRY is set to "H" and the external control signal MSN is set to "L" at the leading edge of the clock signal CLK, and whereby external address signals ADD0 to ADDi are taken in and the read operation is started (time t0).

The control gate line CGL specified by the external address signals ADD0 to ADDi rises to "H" and the signal CADP falls to "L". When the signal CADP falls to "L", the flip-flop 55 is set and the signals RDPF, RDP and IRE rise to "H". When the signal IRE rises to "H", the reference voltage source 16 and the charge pump circuit 17 are activated.

When the signal RDP rises to "H", the switches 82 and 105 of the selected memory mat MAT are turned on, and the voltage VRF of sub-voltage line VL corresponding to the switches 82 and 105 begins to rise. In addition, the comparison circuit 106 is activated when the signal RDP rises to "H", whereas the signal ICMP falls to "L" because the voltage VRF is still low. Although the high voltage Vpp begins to rise when the charge pump circuit 17 is activated, the signal PCMP falls to "L" because the level of the high voltage Vpp is still low. In addition, the logical product signal CMPA of the signals ICMP and PCMP also falls to "L".

When the signal RDPF rises to "H", the ring oscillator 91 is activated and the output signal DE of the decoder 93 falls to "L" for one clock period after a predefined time period Td1. The time period Td1 is preliminarily set as a standard time period required for the voltage VRF of the sub-voltage line VL to be saturated and stabilized. When the signal DE falls to "L", the flip-flop 94 is set and the signal DLY rises to "H". Although the signal RDM immediately rises to "H" if the voltages VRF and Vpp have already risen to a predefined voltage in this occasion, it waits until the voltages VRF and Vpp reach a predefined voltage because, in FIG. 24, the voltages VRF and Vpp have not yet reached a predefined voltage.

When the voltage VRF reaches a predefined voltage, the node N3 of FIG. 18 turns to "L" and the signal ICMP rises to "H". Subsequently, when the high voltage Vpp reaches the target voltage, the signals PCMP and CMPA rise to "H". When the signal RDM rises to "H", and the precharge signal PC falls to "L" for a predefined time period and subsequently the signal SAEF and the sense amplifier activation signal SAE rise to "H" for a predefined time period, the data read operation is performed in the sense amplifiers SA0 to SAm, and the data signals Q0 to Qm are output. When the signal SAEF falls to "L", the signals RDPF, RDP, IRE, RDM and DLY are reset to "L".

With the embodiment 5, consumption current can be reduced because the reference current IR and the high voltage Vpp activate the reference voltage source 16 and the charge pump circuit 17 only for a necessary period of time in the low-speed read mode. However, direct current component may increase if rise of the reference voltage VR is slow, and therefore load of the reference voltage source 16 is reduced (to one fourth in the embodiment 5) by supplying the reference voltage VR only to the selected memory mat MAT, thereby quickening the rise of the reference voltage VR.

Because accurate reading may not be performed if the read operation is performed in the middle of the rise of the reference voltage VR and the high voltage Vpp, the sense amplifier SA is activated after the reference voltage VR and the high voltage Vpp have reached a predefined voltage. That is, although the reference voltage VR and the high voltage Vpp usually rise to a sufficient level within the delay time Td1 of the delay circuit 90, there is a possibility that the reference voltage VR and the high voltage Vpp do not rise within the delay time Td1 if the manufacturing process, the power supply voltage, or the temperature fluctuated beyond the assumed range. With the embodiment 5, accurate read operation can be performed even in such a case.

Although a case has been described with the embodiment 5 that uses one type of reference voltage source 16 and one type of charge pump circuit 17, the sense amplifier SA may be activated after each of the plurality of types of reference voltages and the plurality of types of charge pump circuits reached a predefined voltage, when the plurality of types of reference voltage sources and the plurality of types of charge pump circuits are used.

Figure 25:
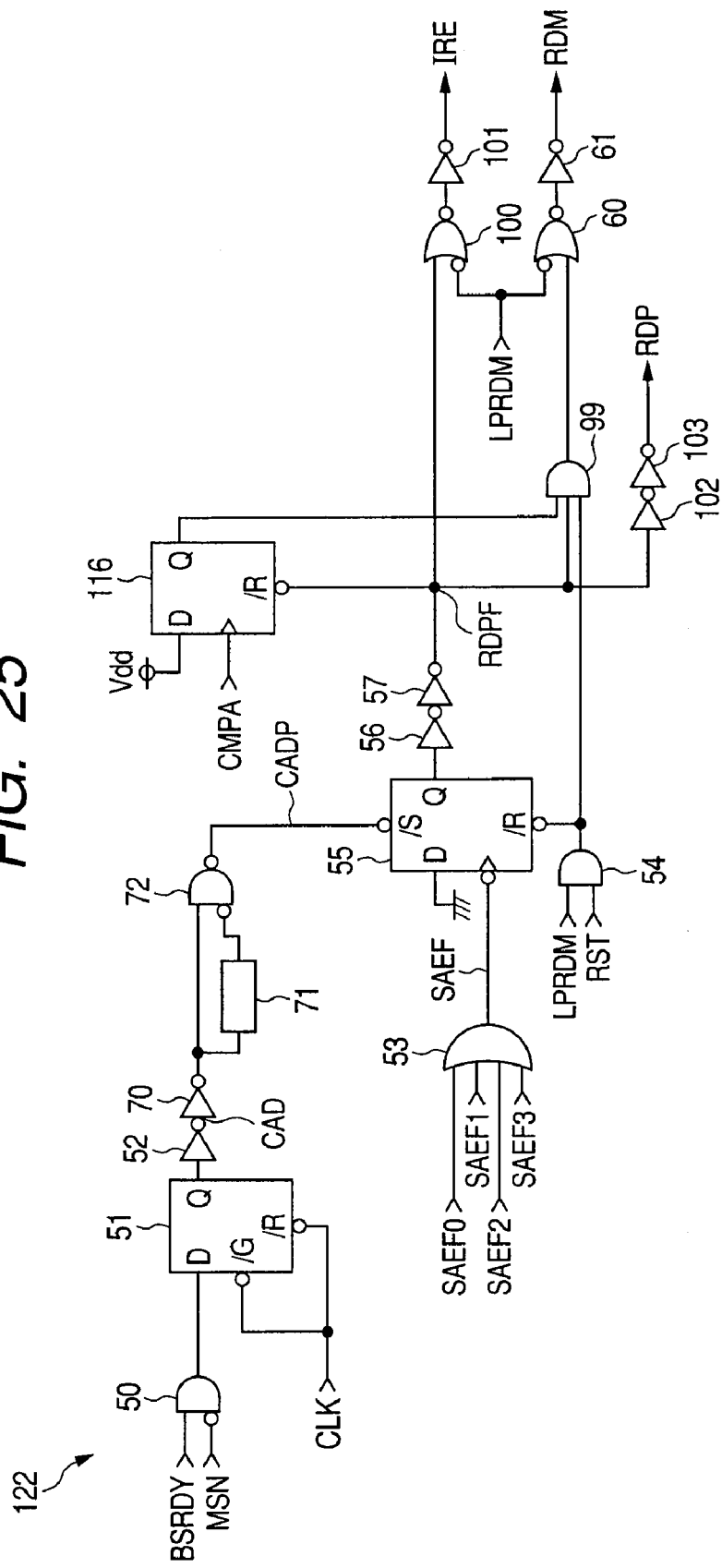
FIG. 25 is a circuit block diagram illustrating an exemplary modification of the embodiment 5.

FIG. 25 is a circuit block diagram illustrating an exemplary modification of the embodiment 5, for comparison with FIG. 21. In the flash memory of FIG. 25, the read control circuit 121 is replaced by a read control circuit 123. Although the signal ICMP is input to the clock terminal of the flip-flop 116 in the read control circuit 115, the signal CMPA is input to the clock terminal of the flip-flop 116 in the read control circuit 123. In this exemplary modification, therefore, the sense amplifier SA is always activated after the reference voltage VR and the high voltage Vpp have reached a predefined voltage.

Although a flash memory having a split gate memory cell MC has been described in the embodiments 1 to 5, the present invention may be applied to a flash memory having a floating gate memory cell MC. Rise of voltage occurs in the memory gate line MGL due to the coupling capacitance 7 between the control gate line CGL and the memory gate line MGL in a split gate flash memory, whereas rise of voltage occurs in the word line due to the coupling capacitance between adjacent two word lines (read control lines) in a floating gate flash memory. Recently, influence of noise that is generated from one of the two adjacent word lines to the other is increasing because the word line pitch is narrowing as memory devices are more highly integrated. Therefore, it is also advantageous to apply the present invention to a floating gate flash memory.

It is needless to say that the embodiments 1 to 5 may be combined as appropriate. It should be considered that the embodiments disclosed herein are illustrative only and not limiting. The scope of the present invention, which is defined by the appended claims and not by the foregoing description, is intended to include any change, modification, or variation falling within the scope of claims as well as meaning and range of equivalence thereof.

What is claimed is :

1. A nonvolatile semiconductor memory device having a first read mode for performing a normal read operation and a second read mode for performing a read operation with lower power consumption than that of the first read mode, the device comprising:
   a memory block that includes a plurality of memory cells arranged in a plurality of rows and in a plurality of columns;
   a selection circuit that selects, in response to the leading edge of a clock signal, any one of the memory cells, according to an external address signal; and
   a read circuit that reads data from the memory cell selected by the selection circuit in response to the leading edge of the clock signal in the first read mode, whereas, in the second read mode, reads data from the memory cell selected by the selection circuit in response to the trailing edge of the clock signal.

2. The nonvolatile semiconductor memory device according to claim 1, wherein: the memory block includes a plurality of memory gate lines respectively provided corresponding to the rows; each memory cell includes a memory transistor having its gate coupled to a corresponding memory gate line; and the memory block further includes:
   a transistor provided corresponding to each memory gate line and coupled between the corresponding memory gate line and a line of a basic voltage;
   a charge pump circuit that generates an internal voltage higher than the power supply voltage; and
   a switching circuit that provides the internal voltage to the gate of the transistor in the first read mode to turn on the transistor, whereas, in the second read mode, provides the power supply voltage to the gate of the transistor to turn on the transistor; and wherein
   the read circuit applies a read voltage between the drain and source of the memory transistor of the memory cell selected by the selection circuit, compares the current flowing through the memory transistor with a reference current and, based on the result of comparison, reads data stored in the memory transistor.

3. A nonvolatile semiconductor memory device having a first read mode for performing a normal read operation and a second read mode for performing a read operation with lower power consumption than that of the first read mode, the device comprising:
   a memory block that includes a plurality of memory cells arranged in a plurality of rows and a plurality of columns, wherein the memory cells are preliminarily divided into a plurality of memory cell groups, each of the memory cell groups is preliminarily divided into N subgroups (N is an integer of two or more), and each of the subgroups includes M memory cells (M is a natural number);
   a selection circuit that selects any one of the memory cell groups according to an external address signal; and
   a read circuit that reads data from N×M memory cells belonging to the memory cell group selected by the selection circuit in the first read mode, whereas, in the second read mode, sequentially selects one by one the N subgroups belonging to the memory cell group selected by the selection circuit, and reads data from M memory cells belonging to each selected subgroup.

4. The nonvolatile semiconductor memory device according to claim 3, wherein each memory cell includes a memory transistor, and the memory block includes a source line coupled to the source of each memory transistor and further includes:
   a transistor coupled between the source line and a line of a basic voltage;
   a charge pump circuit that generates an internal voltage higher than the power supply voltage; and
   a switching circuit that provides the internal voltage to the gate of the transistor in the first read mode to turn on the transistor, whereas, in the second read mode, provides the power supply voltage to the gate of the transistor to turn on the transistor; and wherein the read circuit applies a read voltage to the drain of the memory transistor of the memory cell selected by the selection circuit, compares the current flowing through the memory transistor with a reference current and, based on the result of comparison, reads data stored in the memory transistor.

5. A nonvolatile semiconductor memory device having a first read mode for performing a normal read operation and a second read mode for performing a read operation with lower power consumption than that of the first read mode, the device comprising:
   a plurality of memory blocks each including a plurality of memory cells arranged in a plurality of rows and a plurality of columns;
   a selection circuit that selects, according to an external address signal, any one of the memory blocks and any one of the memory cells belonging to the memory block;
   a plurality of sense amplifiers which is respectively provided corresponding to the memory blocks, and each of which, when a memory cell of a corresponding memory block is selected by the selection circuit, applies a read voltage to the memory cell, compares the current flowing through the memory cell with a reference current, and outputs a data signal having a logic level according to the result of comparison; and
   a reference current supply circuit that supplies the reference current to each of the sense amplifiers in the first read mode, whereas, in the second read mode, supplies the reference current only to the sense amplifier corresponding to the memory block selected by the selection circuit among the sense amplifiers.

6. The nonvolatile semiconductor memory device according to claim 5, wherein each sense amplifier includes a reference current source that flows reference current with a level according to a reference voltage, and the reference current supply circuit includes: a reference voltage source that generates the reference voltage; and a switching circuit that provides the reference voltage to the reference current source of each of the sense amplifiers in the first read mode, whereas, in the second read mode, provides the reference voltage only to the reference current source of the sense amplifier corresponding to the memory block selected by the selection circuit among the sense amplifiers.

7. The nonvolatile semiconductor memory device according to claim 6, wherein the selection circuit selects the memory block and the memory cell according to an external address signal when a read request signal is input, and the reference voltage source is always activated in the first read mode, whereas, in the second read mode, is activated for a predefined time period in response to the read request signal.

8. The nonvolatile semiconductor memory device according to claim 5, comprising:
a comparison circuit that compares the reference current of a sense amplifier corresponding to the memory block selected by the selection circuit with a predefined constant current and outputs a first signal in response to the fact that the reference current exceeded the constant current; and
a control circuit that activates the sense amplifier in response to the fact that the first signal was output from the comparison circuit.

9. The nonvolatile semiconductor memory device according to claim 8, wherein: each memory block includes a plurality of read control lines and source lines respectively provided corresponding to the rows; each memory cell includes a memory transistor having its gate coupled to a corresponding read control line and its source coupled to the source line; and the memory block further includes:
a first transistor provided corresponding to each memory gate line and coupled between a corresponding memory gate line and a line of a basic voltage;
a second transistor provided corresponding to each source line and coupled between a corresponding source line and a line of the basic voltage; and
a charge pump circuit that generates, in the first and second read modes, an internal voltage higher than a power supply voltage and outputs a second signal in response to the fact that the internal voltage has reached a target voltage, and wherein the control circuit activates the sense amplifier in response to the fact that the first signal was output from the comparison circuit and the second signal was output from the charge pump circuit.

10. A nonvolatile semiconductor memory device having a first read mode for performing a normal read operation and a second read mode for performing a read operation with lower power consumption than that of the first read mode, the device comprising:

a plurality of memory blocks each including a plurality of memory cells arranged in a plurality of rows and a plurality of columns;
a selection circuit that selects, in response to the leading edge of a clock signal, any one of the memory blocks and any one of the memory cells belonging to the memory block according to an external address signal; and
a read circuit that reads data from the memory cell selected by the selection circuit in response to the leading edge of the clock signal in the first read mode, whereas, in the second read mode, reads data from the memory cell selected by the selection circuit in response to the trailing edge of the clock signal, wherein the read circuit includes:
a plurality of sense amplifiers which is respectively provided corresponding to the memory blocks, and each of which, when a memory cell of a corresponding memory block is selected by the selection circuit, applies a read voltage to the memory cell, compares the current flowing through the memory cell with a reference current, and outputs a data signal having a logic level according to the result of comparison; and
a reference current supply circuit that supplies the reference current to each of the sense amplifiers in the first read mode, whereas, in the second read mode, supplies the reference current only to the sense amplifier corresponding to the memory block selected by the selection circuit among the sense amplifiers.

11. A nonvolatile semiconductor memory device having a first read mode for performing a normal read operation and a second read mode for performing a read operation with lower power consumption than that of the first read mode, the device comprising:
a plurality of memory blocks each including a plurality of memory cells arranged in a plurality of rows and a plurality of columns, wherein the memory cells are preliminarily divided into a plurality of memory cell groups, each of the memory cell groups is preliminarily divided into N subgroups (N is an integer of two or more), and each of the subgroups has M memory cells (M is a natural number);
a selection circuit that selects any one of the memory blocks and any one of the memory cell groups belonging to the memory block according to an external address signal; and
a read circuit that reads data from N×M memory cells belonging to the memory cell group selected by the selection circuit in the first read mode, whereas, in the second read mode, sequentially selects one by one the N subgroups belonging to the memory cell group selected by the selection circuit, and reads data from M memory cells of each selected subgroup, wherein the read circuit includes:
N×M sense amplifiers provided corresponding to each memory block and preliminarily divided into N sense amplifier groups, wherein, when a memory cell group of a corresponding memory block is selected by the selection circuit, each sense amplifier applies a read voltage to a corresponding memory cell, compares the current flowing through the corresponding memory cell with a reference current, and outputs a data signal having a logic level according to the result of comparison;

a control circuit provided corresponding to each memory block, wherein, when a memory cell group of a corresponding memory block is selected by the selection circuit, the control circuit sequentially selects one by one the N sense amplifier groups and activates the M sense amplifiers of each selected sense amplifier group; and a reference current supply circuit that supplies the reference current to each of all the sense amplifiers in the first read mode, whereas, in the second read mode, supplies the reference current only to the sense amplifier corresponding to the memory block selected by the selection circuit among all the sense amplifiers.

* * * * *